(12) United States Patent
Myeong et al.

(10) Patent No.: US 12,725,666 B2
(45) Date of Patent: Sep. 1, 2026

(54) NON-VOLATILE MEMORY DEVICE AND A METHOD OF OPERATING THE SAME

(71) Applicant: SAMSUNG ELECTRONICS CO., LTD., Suwon-si (KR)

(72) Inventors: Ilho Myeong, Suwon-si (KR); Kwangsoo Kim, Suwon-si (KR); Suseong Noh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 117 days.

(21) Appl. No.: 18/796,585

(22) Filed: Aug. 7, 2024

(65) Prior Publication Data

US 2025/0095759 A1 Mar. 20, 2025

(30) Foreign Application Priority Data

Sep. 18, 2023 (KR) ........................ 10-2023-0124275

(51) Int. Cl.
*G11C 16/32* (2006.01)
*G11C 16/10* (2006.01)
*G11C 16/34* (2006.01)

(52) U.S. Cl.
CPC ........ *G11C 16/3459* (2013.01); *G11C 16/102* (2013.01); *G11C 16/32* (2013.01)

(58) Field of Classification Search
CPC ... G11C 16/3459; G11C 16/102; G11C 16/32; G11C 11/5628; G11C 16/0483;
(Continued)

(56) References Cited

U.S. PATENT DOCUMENTS 7,616,496 B2 11/2009 Choi et al.
7,679,133 B2 3/2010 Son et al.
(Continued)

FOREIGN PATENT DOCUMENTS

KR 10-0885782 B1 2/2009
KR 10-1177286 B1 8/2012
(Continued)

OTHER PUBLICATIONS

W-D. Liu et al., "Impact of Series-Connected Ferroelectric Capacitor in HfO2-Based Ferroelectric Field-Effect Transistors for Memory Application", IEEE JEDS 2020, vol. 8, 2020, pp. 1076-1081.
(Continued)

*Primary Examiner* — Xiaochun L Chen
(74) *Attorney, Agent, or Firm* — Morgan, Lewis & Bockius LLP

(57) ABSTRACT

A method of operating a memory device, the method including: applying a program inhibition voltage to an unselected bit line in a first program loop of a plurality of program loops; applying a program permission voltage to a selected bit line in the first program loop; applying a pass voltage to an unselected word line in the first program loop; applying a program voltage to a selected word line in the first program loop; applying a pulse voltage having a polarity opposite to a polarity of the program voltage to the selected word line after applying the program voltage to the selected word line, in the first program loop; and applying a verification voltage to the selected word line after applying the pulse voltage to the selected word line, in the first program loop.

17 Claims, 21 Drawing Sheets

(58) Field of Classification Search
CPC ......... G11C 16/08; G11C 16/10; G11C 16/24; G11C 16/30
See application file for complete search history.

(56) References Cited

U.S. PATENT DOCUMENTS

| | | | | |
|---|---|---|---|---|
| 7,751,254 | B2 | 7/2010 | Park et al. | |
| 8,199,581 | B2 | 6/2012 | Kim | |
| 8,553,466 | B2 | 10/2013 | Han et al. | |
| 8,559,235 | B2 | 10/2013 | Yoon et al. | |
| 8,644,046 | B2 | 2/2014 | Seol et al. | |
| 8,654,587 | B2 * | 2/2014 | Yoon ........................ | A62B 9/04 365/185.27 |
| 9,230,663 | B1 | 1/2016 | Lu et al. | |
| 9,424,947 | B2 | 8/2016 | Kwak et al. | |
| 2007/0036001 | A1 * | 2/2007 | Kanda .................... | G11C 16/12 365/185.18 |
| 2011/0233648 | A1 | 9/2011 | Seol et al. | |

FOREIGN PATENT DOCUMENTS

| | | | |
|---|---|---|---|
| KR | 10-1281683 | B1 | 7/2013 |
| KR | 10-2015-0015578 | A | 2/2015 |
| KR | 10-1609793 | B1 | 4/2016 |
| KR | 10-1642819 | B1 | 7/2016 |
| KR | 10-1818793 | B1 | 2/2018 |

OTHER PUBLICATIONS

K. Florent, et al., "Understanding ferroelectric Al:HfO2 thin films with Si-based electrodes for 3D applications", Journal of Applied Physics 121, 204103 (2017), pp. 204103-1-204103-8.

Xuan Tian, et al., "Evolution of ferroelectric HfO2 in ultrathin region down to 3nm", Applied Physics Letters 112, 102902 (2018), pp. 102902-1-102902-5.

* cited by examiner

PROGRAM LOOP 1
PROGRAM LOOP 2
...
PROGRAM LOOP N−1
PROGRAM LOOP N
PGM EXECUTION
VERIFY
unselected
Vinhibit
selected
Vpre
Vpass
Vpass
Vpgm
T1
T2
Vnp
Vvfy
BL
UNSELECTED WL
SELECTED WL 500
C1
C2
C3
D1
D2
D3
PA
WLBA
BLBA
840
830
740
730
THV1
THV2
CELL2
CELL1
PERI
A1
A2
B1
B2
CH
LCH
UCH
Z
Y
X

NON-VOLATILE MEMORY DEVICE AND A METHOD OF OPERATING THE SAME

CROSS-REFERENCE TO RELATED APPLICATION

This application claims priority under 35 U.S.C. § 119 to Korean Patent Application No. 10-2023-0124275, filed on Sep. 18, 2023, in the Korean Intellectual Property Office, the disclosure of which is incorporated by reference herein in its entirety.

TECHNICAL FIELD

The inventive concept relates to a non-volatile memory device, and more particularly, to a method of programming a non-volatile memory device.

DISCUSSION OF RELATED ART

A memory device may be categorized into two types: volatile and non-volatile. A ferroelectric memory device is one example of a non-volatile memory device. In general, in flash memory devices, a shift in the threshold voltage occurs due to the accumulation of electrons in a floating gate or a charge trap layer. However, in ferroelectric memory devices, a shift in the threshold voltage is determined by the polarization direction of a ferroelectric layer.

In addition, non-volatile memory devices, including electrically erasable programmable read-only memory (EEPROM) and flash memory devices, have the capability to store data when power is disconnected. These devices also allow for the deletion of existing data and programming of new data. The non-volatile memory devices may be used in semiconductor products, such as storage media for mobile devices or portable memory sticks.

As the semiconductor industry moves towards miniaturization, non-volatile memory devices used in semiconductor products are achieving higher levels of integration. For example, a non-volatile memory device that stacks non-volatile memory elements in a three-dimensional structure can achieve a greater degree of integration compared to devices where non-volatile memory elements are arranged in a two-dimensional planar structure.

SUMMARY

The inventive concept relates to a method of programming a non-volatile memory device, and more particularly, to a programming method that quickly stabilizes a program state by applying a pulse voltage having a polarity opposite to that of a program voltage right after the program voltage is applied to a selected word line.

According to an embodiment of the inventive concept, there is provided a method of operating a memory device, the method including: applying a program inhibition voltage to an unselected bit line in a first program loop of a plurality of program loops; applying a program permission voltage to a selected bit line in the first program loop; applying a pass voltage to an unselected word line in the first program loop; applying a program voltage to a selected word line in the first program loop; applying a pulse voltage having a polarity opposite to a polarity of the program voltage to the selected word line after applying the program voltage to the selected word line, in the first program loop; and applying a verification voltage to the selected word line after applying the pulse voltage to the selected word line, in the first program loop.

According to an embodiment of the inventive concept, there is provided a method of operating a memory device, the method including: applying a program inhibition voltage to an unselected bit line in each of a plurality of program loops; applying a program permission voltage to a selected bit line in each of the plurality of program loops; applying a pass voltage to an unselected word line in each of the plurality of program loops; applying a program voltage to a selected word line in each of the plurality of program loops; and applying a pulse voltage having a polarity opposite to a polarity of the program voltage to the selected word line after applying the program voltage to the selected word line in a first program loop of the plurality of program loops.

According to an embodiment of the inventive concept, there is provided a memory device including: a memory cell array connected to a plurality of word lines and a plurality of bit lines; a voltage generator configured to generate voltages to be applied to the plurality of word lines; and a control circuit configured to control a program operation for a plurality of memory cells of the memory cell array, wherein, during the program operation, the control circuit controls the voltage generator to generate a pass voltage to be applied to an unselected word line, and a program voltage and a pulse voltage having a polarity opposite to a polarity of the program voltage to be sequentially applied to a selected word line.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
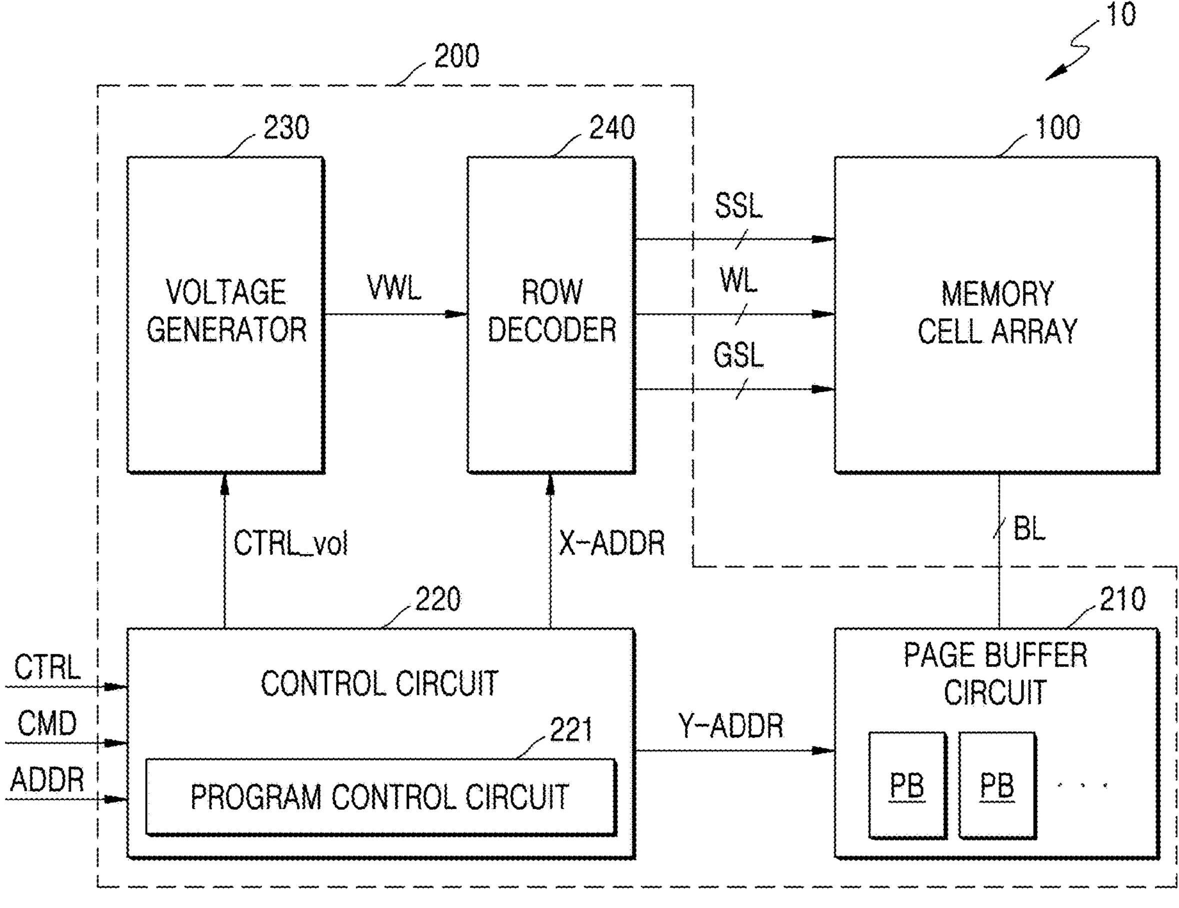
FIG. 1 is a block diagram illustrating a memory device according to an embodiment.

FIG. 1 is a block diagram of a memory device 10 according to an example embodiment. Referring to FIG. 1, the memory device 10 may include a memory cell array 100 and a peripheral circuit 200. The peripheral circuit 200 may include a page buffer circuit 210, a control circuit 220, a voltage generator 230, and a row decoder 240. The peripheral circuit 200 may further include a data input/output circuit or an input/output interface, etc. In addition, the peripheral circuit 200 may further include a column logic, a pre-decoder, a temperature sensor, a command decoder, and/or an address decoder.

The memory cell array 100 may be connected to the page buffer circuit 210 through bit lines BL and be connected to the row decoder 240 through word lines WL, string selection lines SSL, and ground selection lines GSL. The memory cell array 100 may include a plurality of memory cells. For example, the plurality of memory cells may be flash memory cells. Hereinafter, embodiments of the inventive concept will be described where the plurality of memory cells are ferroelectric NAND flash memory cells as an example. However, the inventive concept is not limited thereto, and in some embodiments, the plurality of memory cells may be other NAND flash memory cells, such as resistive RAM (ReRAM) cells, phase change RAM (PRAM) cells, or magnetic RAM (MRAM) cells.

In an example embodiment, the memory cell array 100 may include a three dimensional (3D) memory cell array, which includes a plurality of NAND strings. Each of the NAND strings may include memory cells respectively connected to word lines vertically stacked on a substrate. The disclosures of U.S. Pat. Nos. 7,679,133; 8,553,466; 8,654,587; 8,559,235; and U.S. Pat. Pub. No. 2011/0233648 are incorporated by reference herein in their entireties. In an example embodiment, the memory cell array 100 may include a two dimensional (2D) memory cell array, which includes a plurality of NAND strings arranged in a row direction and a column direction.

The control circuit 220 may control various operations of the memory device 10. The control circuit 220 may output various control signals, for example, a voltage control signal CTRL_vol, a row address X-ADDR, and a column address Y-ADDR to read data from the memory cell array 100, to program data to the memory cell array 100 or to erase data stored in the memory cell array 100, based on commands CMD, addresses ADDR and/or control signals CTRL.

The voltage generator 230 may generate various kinds of voltages for program, read, and erase operations based on the voltage control signal CTRL_vol. For example, the voltage generator 230 may generate a program voltage, a read voltage, a program verification voltage, a pass voltage, an erase voltage, and an erase verification voltage as a word line voltage VWL. Furthermore, the voltage generator 230 may generate a string selection line voltage and a ground selection line voltage based on the voltage control signal CTRL_vol.

The row decoder 240 may select one of a plurality of word lines WL and select one of a plurality of string selection lines SSL in response to the row address X-ADDR. For example, the row decoder 240 may apply the program voltage and the program verification voltage to the selected word line WL during a program operation and apply the read voltage to the selected word line WL during a read operation.

The page buffer circuit 210 may include a plurality of page buffers PB, which may be respectively connected to the memory cells through the bit lines BL. The page buffer circuit 210 may select at least one of the bit lines BL in response to the column address Y-ADDR. The page buffer circuit 210 may operate as a write driver or a sense amplifier depending on an operation mode. For example, during a program operation, the page buffer circuit 210 may apply a bit line voltage corresponding to data to be programmed, to the selected bit line. During a read operation, the page buffer circuit 210 may sense a current or a voltage of the selected bit line BL and sense data stored in the memory cell.

When the program operation is performed, the memory cells of the memory cell array 100 may be programmed by the program voltage that increases step-by-step. A method of programming a threshold voltage of the memory cells to a target voltage by using the program voltage that increases step-by-step may be referred to as an increment step pulse program (ISPP) scheme. When performing the program operation by using the ISPP scheme, the program voltage applied to the selected word line in a plurality of program loops may increase step-by-step. In other words, the program voltage may increase during each subsequent program loop. When the memory cells included in the memory cell array 100 are ferroelectric NAND flash memory cells, and the program operation is performed by using only a positive program voltage, the threshold voltage of the memory cells may significantly increase immediately after programming. This increase is due to the accumulation of excessive trap charges. Therefore, to stabilize the program state, it may be necessary to allow a period of stabilization time for the release of the excessive trap charges, as described below in detail with reference to FIG. 10.

According to an embodiment, when the program operation is performed by using the ISPP scheme, a program control circuit 221 may control the memory device 10 so that the positive program voltage and a negative pulse voltage are sequentially applied to the word lines WL in the plurality of program loops. Applying the negative pulse voltage to the word lines WL immediately after the positive program voltage is applied to the word lines WL can accelerate the release of trapped charges, thereby quickly stabilizing the program state.

Figure 2:
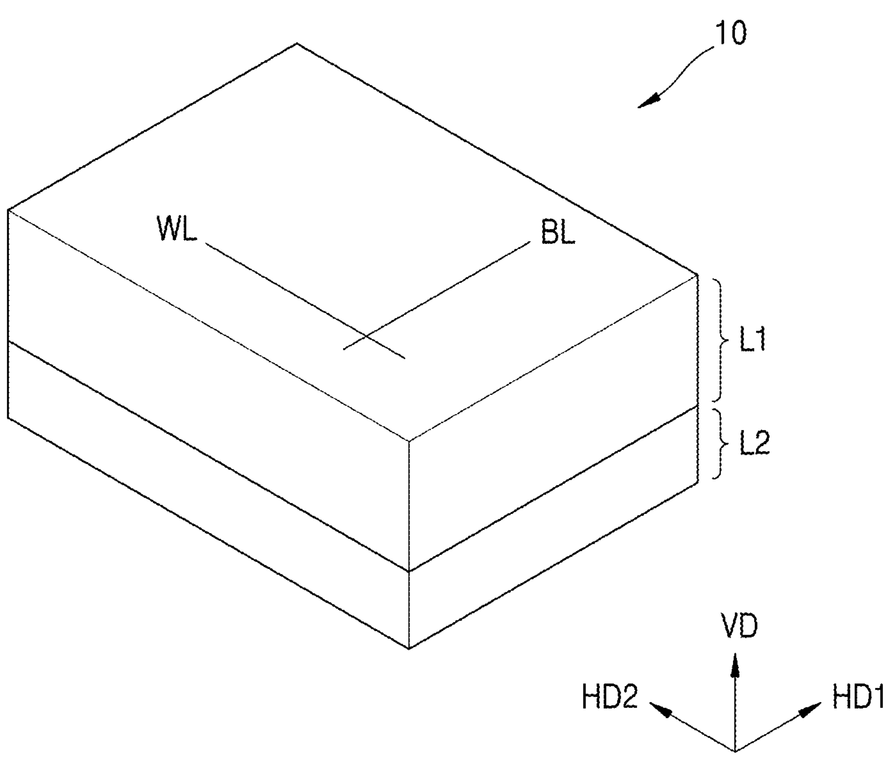
FIG. 2 illustrates a structure of the memory device of FIG. 1 according to an embodiment.

FIG. 2 illustrates a structure of the memory device 10 of FIG. 1 according to an embodiment. Referring to FIG. 2, the memory device 10 may include a first semiconductor layer L1 and a second semiconductor layer L2, and the first semiconductor layer L1 may be stacked in a vertical direction VD with respect to the second semiconductor layer L2. For example, the second semiconductor layer L2 may be arranged under the first semiconductor layer L1 in the vertical direction VD, and thus, the second semiconductor layer L2 may be arranged close to an external substrate.

In an embodiment, the memory cell array 100 of FIG. 1 may be formed in the first semiconductor layer L1 and the peripheral circuit 200 of FIG. 1 may be formed in the second semiconductor layer L2. Accordingly, the memory device 10 may have a structure in which the memory cell array 100 is arranged above the peripheral circuit 200, in other words, a cell over periphery (COP) structure. The COP structure may reduce the horizontal area and may increase a degree of integration of the memory device 10.

In an embodiment, the second semiconductor layer L2 may include a substrate, and the peripheral circuit 200 may be formed in the second semiconductor layer L2 by forming transistors and metal patterns for wiring the transistors on the substrate. After the peripheral circuit 200 is formed in the second semiconductor layer L2, the first semiconductor layer L1 including the memory cell array 100 may be formed, and the metal patterns for electrically connecting the word lines WL and the bit lines BL of the memory cell array 100 to the peripheral circuit 200 formed in the second semiconductor layer L2 may be formed. For example, the bit lines BL may extend in a first horizontal direction HD1 and the word lines WL may extend in a second horizontal direction HD2.

Figure 3:
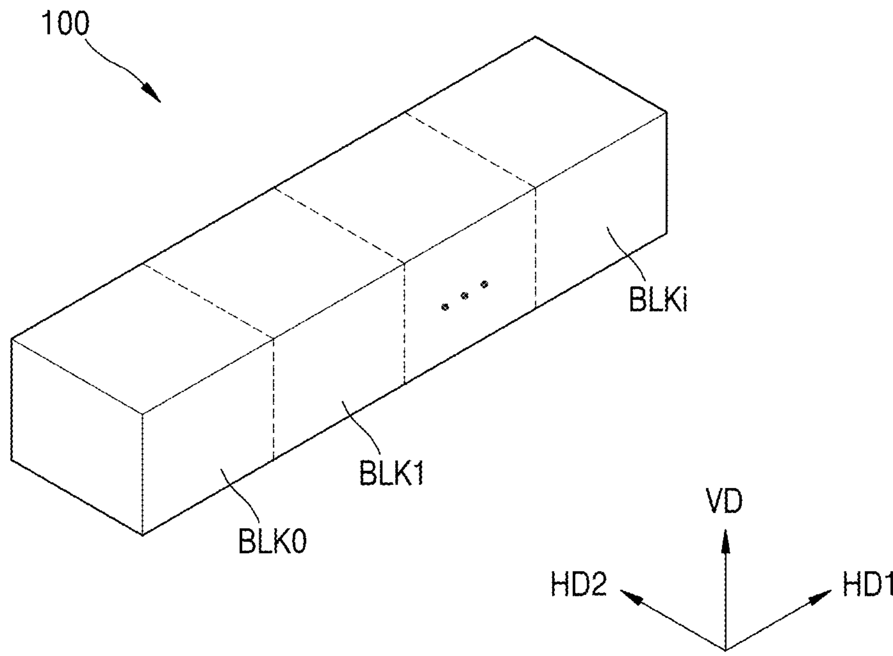
FIG. 3 illustrates the memory cell array of FIG. 1 according to an embodiment.

FIG. 3 illustrates the memory cell array 100 of FIG. 1 according to an embodiment. Referring to FIG. 3, the memory cell array 100 may include a plurality of memory blocks BLK0 to BLKi, where i may be a positive integer. Each of the plurality of memory blocks BLK0 to BLKi may have a three-dimensional structure (or a vertical structure). For example, each of the plurality of memory blocks BLK0 to BLKi may include a plurality of NAND strings extending in the vertical direction VD. In this case, the plurality of NAND strings may be apart from one another by a specific distance in the first and second horizontal directions HD1 and HD2. The plurality of memory blocks BLK0 to BLKi may be selected by the row decoder 240 (refer to FIG. 1). For example, the row decoder 240 may select a memory block corresponding to a block address from the plurality of memory blocks BLK0 to BLKi.

Figure 4:
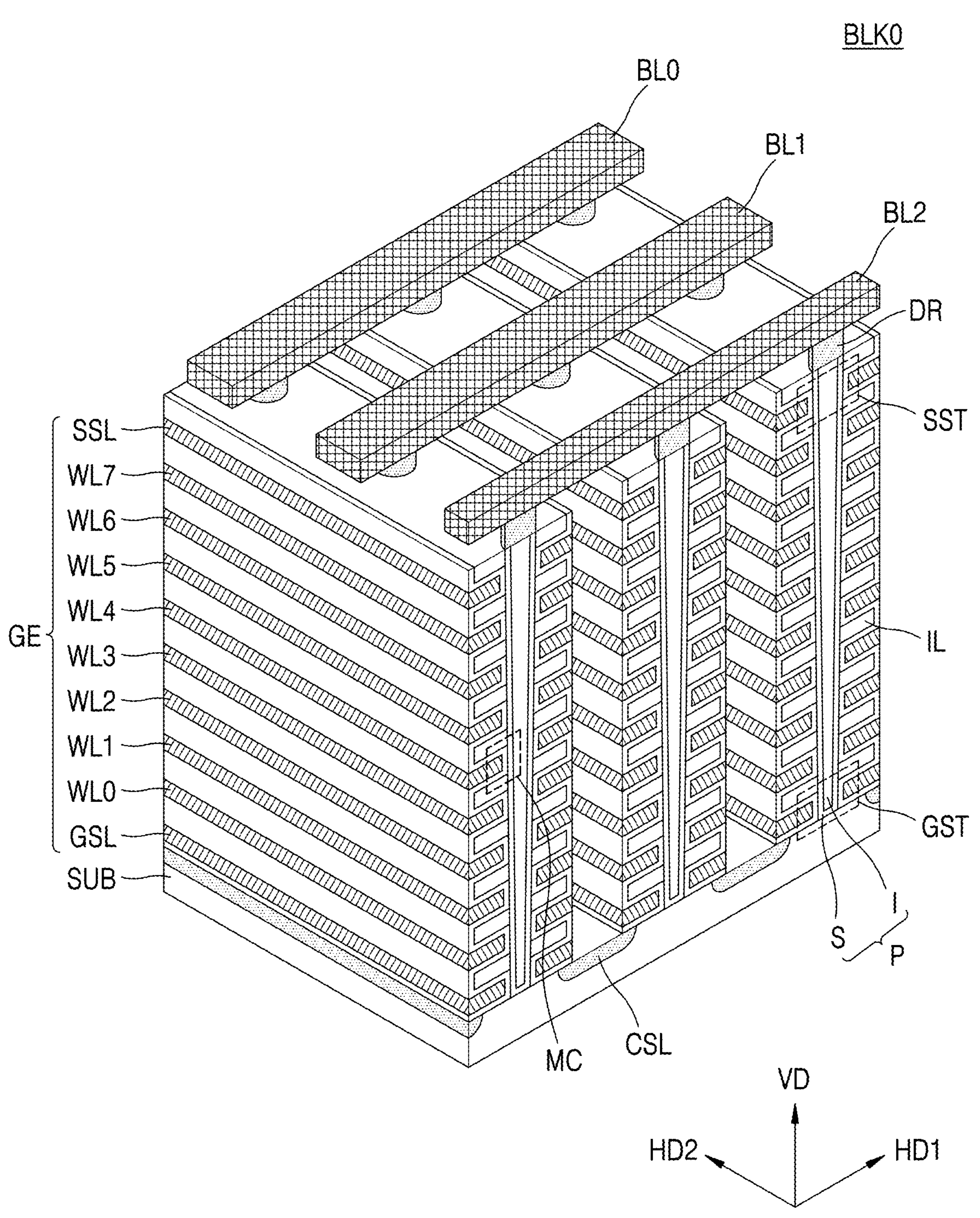
FIG. 4 is a perspective view illustrating a memory block of FIG. 3 according to an embodiment.

FIG. 4 is a perspective view illustrating the memory block BLK0 of FIG. 3 according to an embodiment.

Referring to FIG. 4, the memory block BLK0 is formed in a direction perpendicular to a substrate SUB. In other words, the memory block BLK0 is formed in the vertical direction VD. The substrate SUB has a first conductivity type (for example, p-type), which extends in the second horizontal direction HD2 on the substrate SUB, and is provided with a common source line CSL doped with impurities of a second conductivity type (for example, n-type). On a region of the substrate SUB between two adjacent common source lines CSL, a plurality of insulating layers IL extending in the second horizontal direction HD2 are sequentially provided in the vertical direction VD. The plurality of insulating layers IL are apart from one another by a specific distance in the vertical direction VD. For example, the plurality of insulating layers IL may include an insulating material such as silicon oxide.

On the region of the substrate SUB between the two adjacent common source lines CSL, a plurality of pillars P, which are sequentially arranged in the first horizontal direction HD1 and passing through the plurality of insulating layers IL in the vertical direction VD, are provided. For example, the plurality of pillars P may contact the substrate SUB through the plurality of insulating layers IL. For example, a surface layer S of each pillar P may include a silicon material of a first type and may function as a channel region. In addition, an internal layer I of each pillar P may include an insulating material such as silicon oxide or an air gap.

In a region between two adjacent common source lines CSL, a polarization layer may be provided along exposed surfaces of the plurality of insulating layers IL, the plurality of pillars P, and the substrate SUB. The polarization layer may include a gate insulating layer, a ferroelectric layer, and a blocking insulation layer. In some embodiments, the ferroelectric layer may include $HfO_2$ or $BaTiO_3$. In some embodiments, the gate insulating layer may have an oxide-nitride-oxide (ONO) structure. In some embodiments, the gate insulating layer may be excluded. In addition, in the region between the two adjacent common source lines CSL, gate electrodes GE such as selection lines GSL and SSL and first, second, third, fourth, fifth, sixth, seventh and eighth word lines WL0, WL1, WL2, WL3, WL4, WL5, WL6 and WL7 are provided on the exposed surface of the polarization layer.

Drains DR or drain contacts are provided on the plurality of pillars P, respectively. For example, the drains DR or drain contacts may include a silicon material doped with impurities having the second conductivity type. Bit lines BL1, BL2 and BL3 extending in the first horizontal direction HD1 and apart from one another by a specific distance in the second horizontal direction HD2 are provided on the drains DR.

A memory cell MC may be formed at a point at which the gate electrode GE intersects with the polarization layer.

Figure 5:
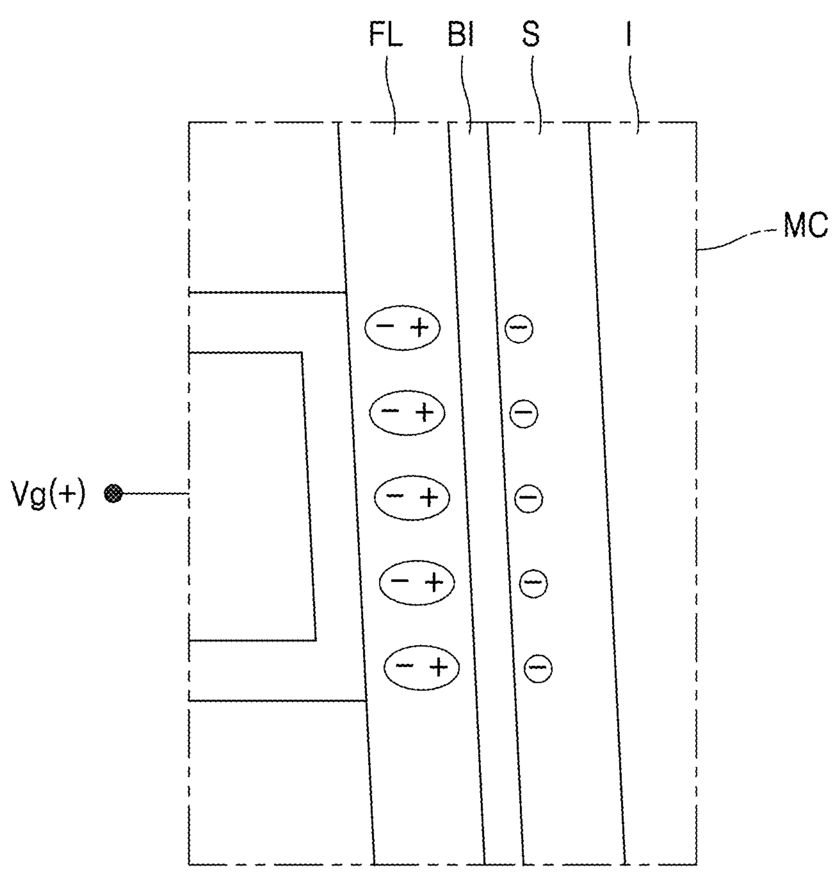
FIG. 5 is a diagram illustrating a memory cell according to an embodiment.

FIG. 5 is a diagram illustrating a memory cell according to an embodiment. FIG. 5 may be described below with reference to FIG. 4.

Referring to FIG. 5, when a positive gate voltage Vg is applied to the gate electrode GE, polarization may occur in a ferroelectric layer FL. For example, a negative charge may be formed in a direction of the gate electrode GE and an positive charge may be formed in a blocking insulation layer BI. Due to ferroelectric characteristics, the polarization of the ferroelectric layer FL may be maintained although the voltage applied to the gate electrode GE is blocked.

Due to the polarization of the ferroelectric layer, negative charges may be induced in the surface layer S functioning as a channel region. Therefore, although a relatively low voltage is applied to the gate electrode GE, a channel may be formed in the memory cell MC, which may lower a threshold voltage of the memory cell MC.

Figure 6A:
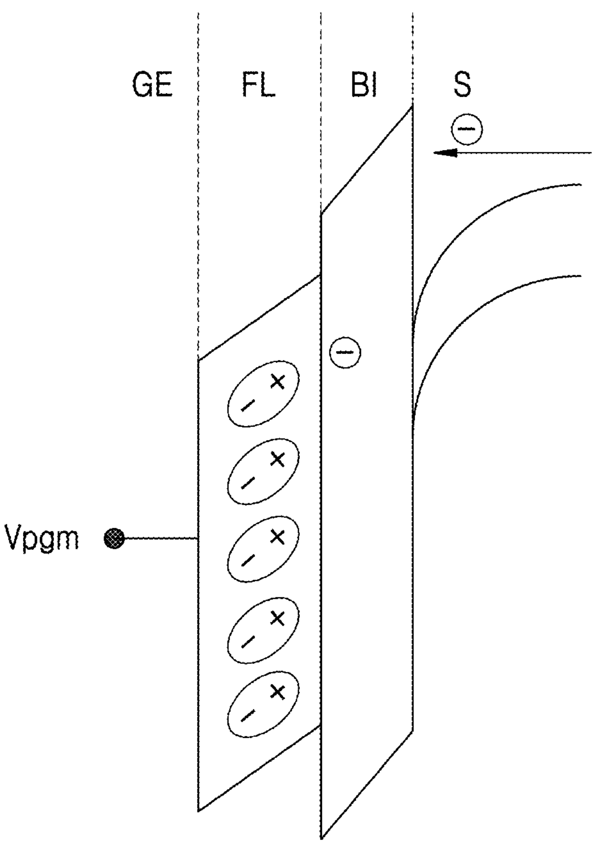
FIGS. 6A, 6B and 6C are diagrams illustrating a band diagram of a memory cell according to an embodiment.
Figure 6B:
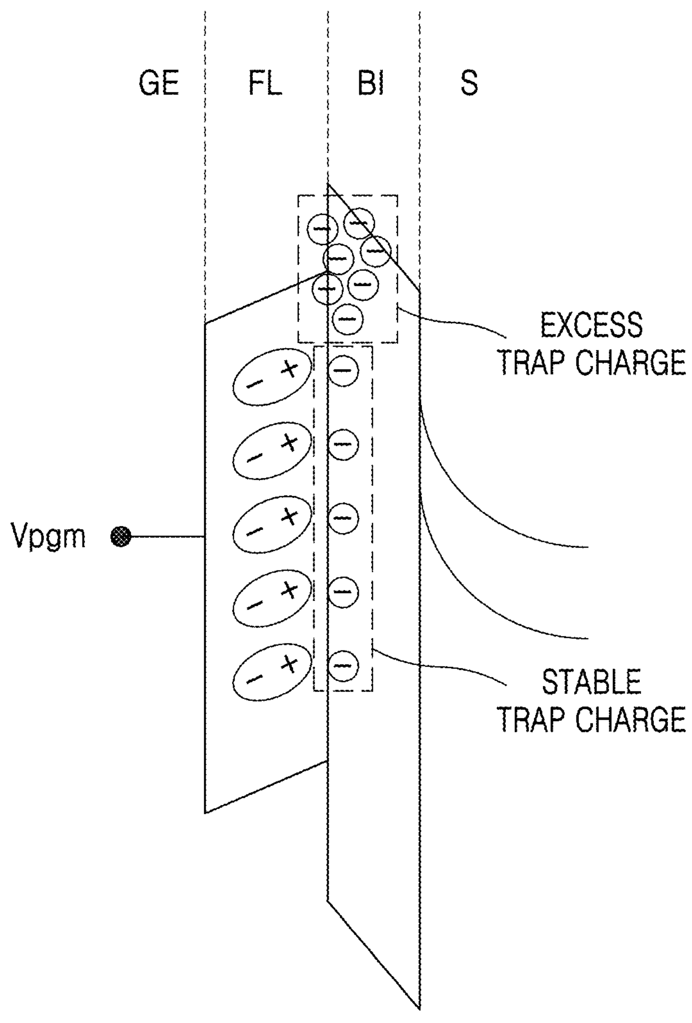
Figure 6C:
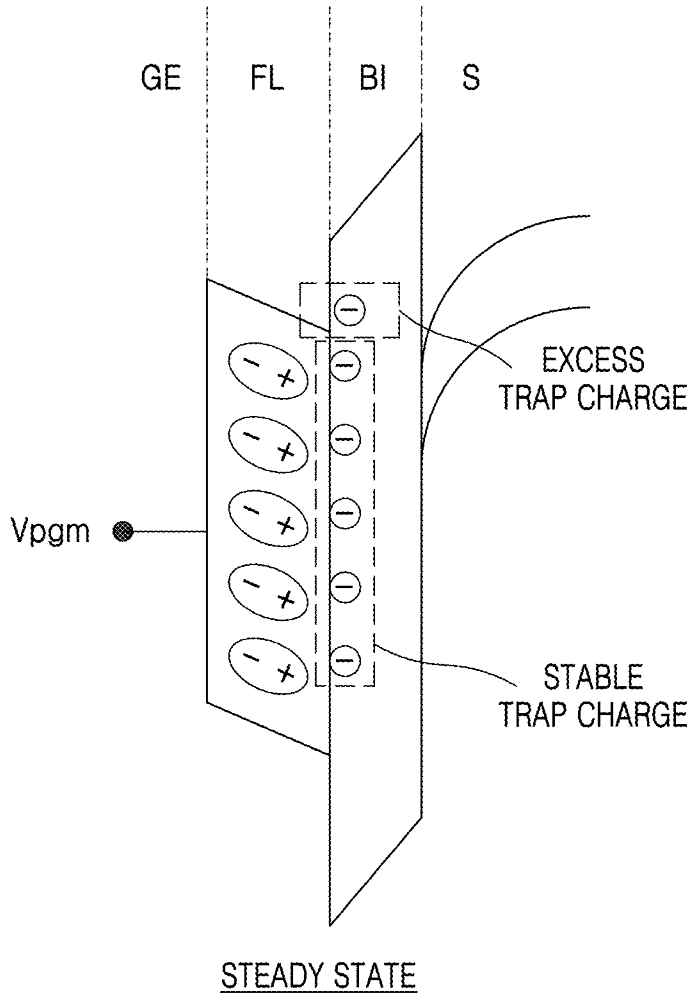

FIGS. 6A to 6C are diagrams illustrating a band diagram of a memory cell according to an embodiment. FIGS. 6A to 6C may be described with reference to FIGS. 4 and 5.

Referring to FIG. 6A, the memory cell may have a metal-ferroelectric-insulator-silicon (MFIS) structure. M may refer to the gate electrode GE, F may refer to the ferroelectric layer FL, I may refer to the blocking insulation layer BI, and S may refer to the surface layer S functioning as the channel region. In some embodiments, the memory cell may have the MFIS structure. In other words, a gate insulating layer may be formed between the gate electrode GE and the ferroelectric layer FL.

Referring to FIG. 6A, a program operation may be performed on the memory cell by applying a program voltage Vpgm to the gate electrode GE. When the positive program voltage Vpgm is applied to the gate electrode GE, polarization occurs in the ferroelectric layer FL. Due to this polarization, negative charges may be induced in the surface layer S close to the blocking insulation layer BI. In addition, some negative charges may be trapped between the ferroelectric layer FL and the blocking insulation layer BI.

Referring to FIG. 6B, immediately (or right) after programming, when application of the program voltage Vpgm is stopped, both stable and excessive trap charges may become trapped between the ferroelectric layer FL and the blocking insulation layer BI. Upon the cessation of the program voltage Vpgm application, the stable trap charges may continue to be trapped due to the polarization of the ferroelectric layer FL, while the excessive trap charges may escape from their trapped state over time.

Referring to FIG. 6C, in the steady state after programming, most of the excessive trap charges may be released, while the stable trap charges may remain trapped. The excessive trap charges may be released by allowing for the stabilization time after programming. According to the embodiment, the release of the excessive trap charges may be accelerated by applying a negative pulse voltage to the gate electrode GE after programming.

Figure 7:
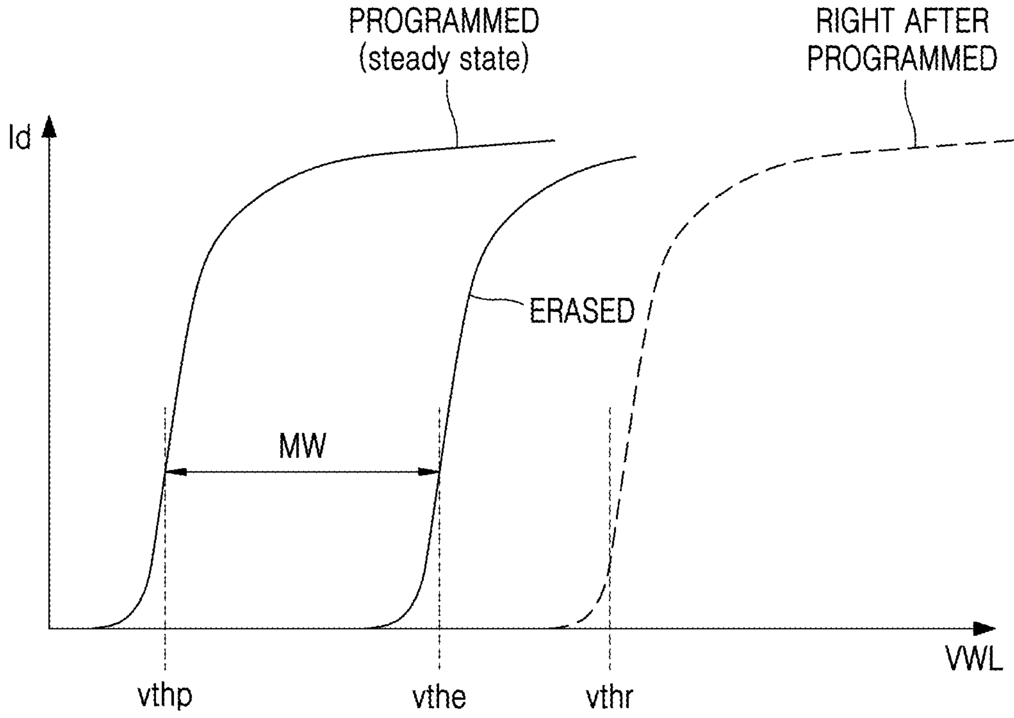
FIG. 7 is a diagram illustrating a threshold voltage of a memory cell according to an embodiment.

FIG. 7 is a diagram illustrating a threshold voltage of a memory cell MC according to an embodiment. FIG. 7 may describe a channel current Id of the memory cell MC based on a word line voltage VWL. FIG. 7 may be described with reference to FIGS. 4 and 5.

In FIG. 7, description is given on the assumption that the memory cell MC is a single-level cell (SLC) in which one bit is stored by being programmed in a program state P or an erase state E. However, the embodiment is not limited thereto. For example, a plurality of bits such as a multi-level cell (MLC), a triple level cell (TLC), and a quad level cell (QLC) may be stored in the memory cell MC.

Referring to FIG. 7, the memory cell MC may initially be in the erase state E. The memory cell MC may be in an erase state by applying a negative erase voltage to the gate electrode GE or by adjusting the erase voltage and a precharge erase voltage of a channel such that the relative voltage between the gate electrode GE and the channel is negative. In the erase state, the threshold voltage of the memory cell MC may be vthe.

The memory cell MC may be programmed by applying the program voltage to the gate electrode GE. As described above with reference to FIG. 6B, immediately (or right) after programming, the excessive trap charges may accumulate between the ferroelectric layer FL and the blocking insulation layer BI, necessitating the application of a higher voltage to the gate electrode GE in order to form a channel in the surface layer S. Right after programming, the threshold voltage of the memory cell MC may be vthr. In some embodiments, vthr may be greater than vthe.

In a steady state after programming is completed, the excessive trap charges may be released, and the threshold voltage of the memory cell MC may be lowered to vthp. vthp may be lower than vthe.

The difference between the threshold voltage vthe in the erase state and the threshold voltage vthp in the steady state may be referred to as a memory window. During a read operation or a verification operation, the program state of the memory cell MC may be determined by using a voltage in the memory window.

In the embodiment, the releasing of the excessive trap charges may be accelerated by sequentially applying the positive program voltage and the negative pulse voltage to the gate electrode GE so that the steady state of the programming may be accelerated and a program time may be reduced.

Figure 8:
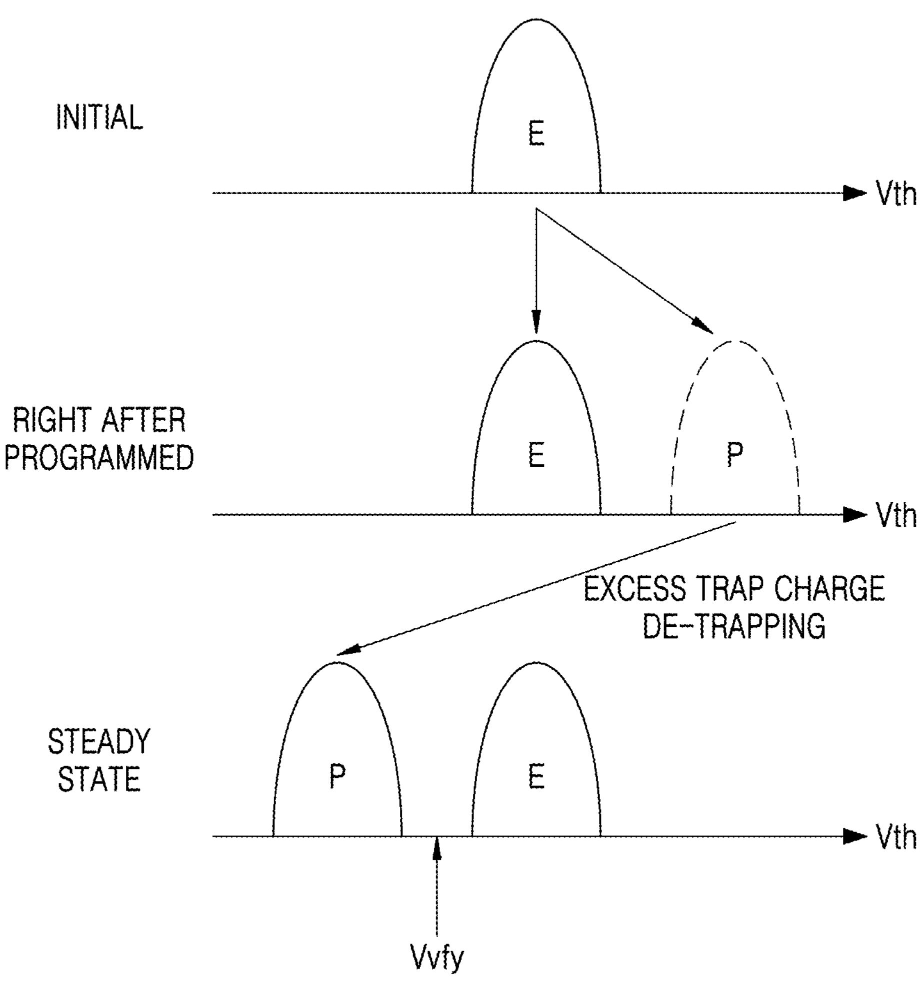
FIG. 8 is a diagram illustrating a program state of a memory cell according to an embodiment.

FIG. 8 is a diagram illustrating a program state of a memory cell MC according to an embodiment. FIG. 8 may be described with reference to FIGS. 1 and 7.

In FIG. 8, description is given on the assumption that the memory cell MC is an SLC in which one bit is stored by being programmed in a program state P or an erase state E. However, the embodiment is not limited thereto. For example, a plurality of bits such as an MLC, a TLC, and a QLC may be stored in the memory cell MC.

Referring to FIG. 8, the memory cell MC may initially be in the erase state E. The program control circuit 221 may program the memory cell MC by controlling the memory device 10 to apply the positive program voltage to a selected word line WL.

Right after the memory cell MC is programmed, the program state P of the memory cell MC may correspond to a threshold voltage higher than the erase state E. The program control circuit 221 may accelerate the release (or detrapping) of the excessive trap charges by controlling the memory device 10 so that the negative pulse voltage is applied to the selected word line WL. By accelerating the release of the excessive trap charges, the program state P may quickly reach a steady state. The program state P in the steady state may correspond to a threshold voltage lower than that of the erase state E.

The program control circuit 221 may verify the program state P in the steady state by controlling the memory device 10 so that a verification voltage Vvfy is applied to the selected word line WL.

Figure 9:
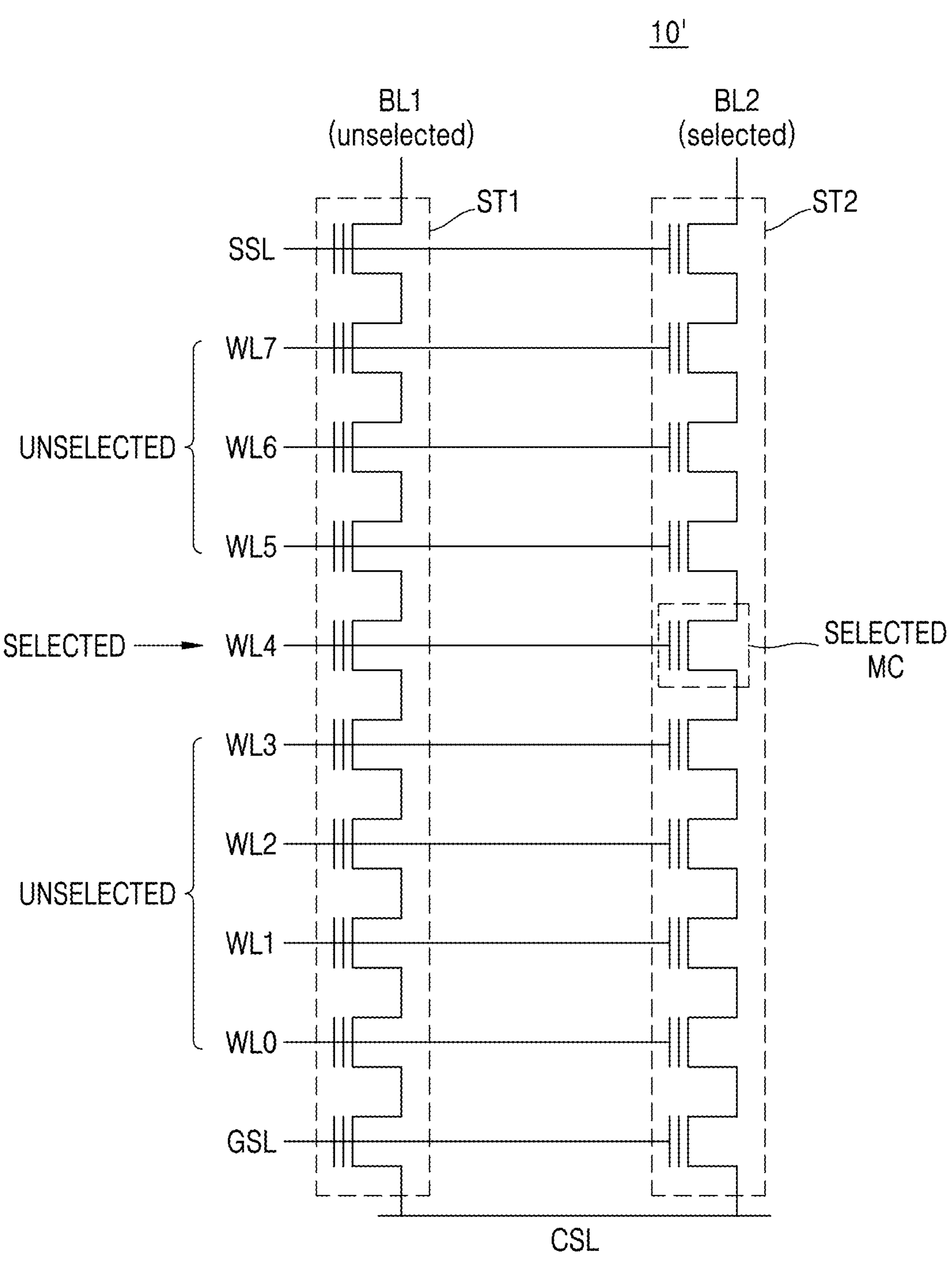
FIG. 9 is a diagram illustrating a structure of a memory device according to an embodiment.

FIG. 9 is a diagram illustrating a structure of a memory device 10' according to an embodiment.

Referring to FIG. 9, the memory device 10' may include a first string ST1 and a second string ST2. However, the number of strings is not limited thereto.

The first string ST1 and the second string ST2 may be commonly connected to a common source line CSL. The first string ST1 may be connected to a first bit line BL1, and the second string ST2 may be connected to a second bit line BL2. The second string ST2 may include a selected memory cell MC to be programmed.

A string selection transistor included in the first string ST1 and the second string ST2 may be connected to a string selection line SSL, and a ground selection transistor included in the first string ST1 and the second string ST2 may be connected to a ground selection line GSL.

Each of the first string ST1 and the second string ST2 may include memory cells connected to first to eighth word lines WL0 to WL7.

In FIG. 9, the fifth word line WL4 may be the selected word line, and the first to fourth and sixth to eighth word lines WL0 to WL3 and WL5 to WL7 may be unselected word lines. The selected word line may be connected to the selected memory cell MC to be programmed. The unselected word lines (e.g., WL0 to WL3 and WL5 to WL7) may be different from the selected word line (e.g., WL4).

In FIG. 9, the first bit line BL1 may be an unselected bit line and the second bit line BL2 may be a selected bit line. The selected bit line (e.g., BL2) may be connected to a string including a memory cell to be programmed, e.g., the second string ST2. The unselected bit line (e.g., BL1) may be different from the selected bit line (e.g., BL2).

Figure 10:
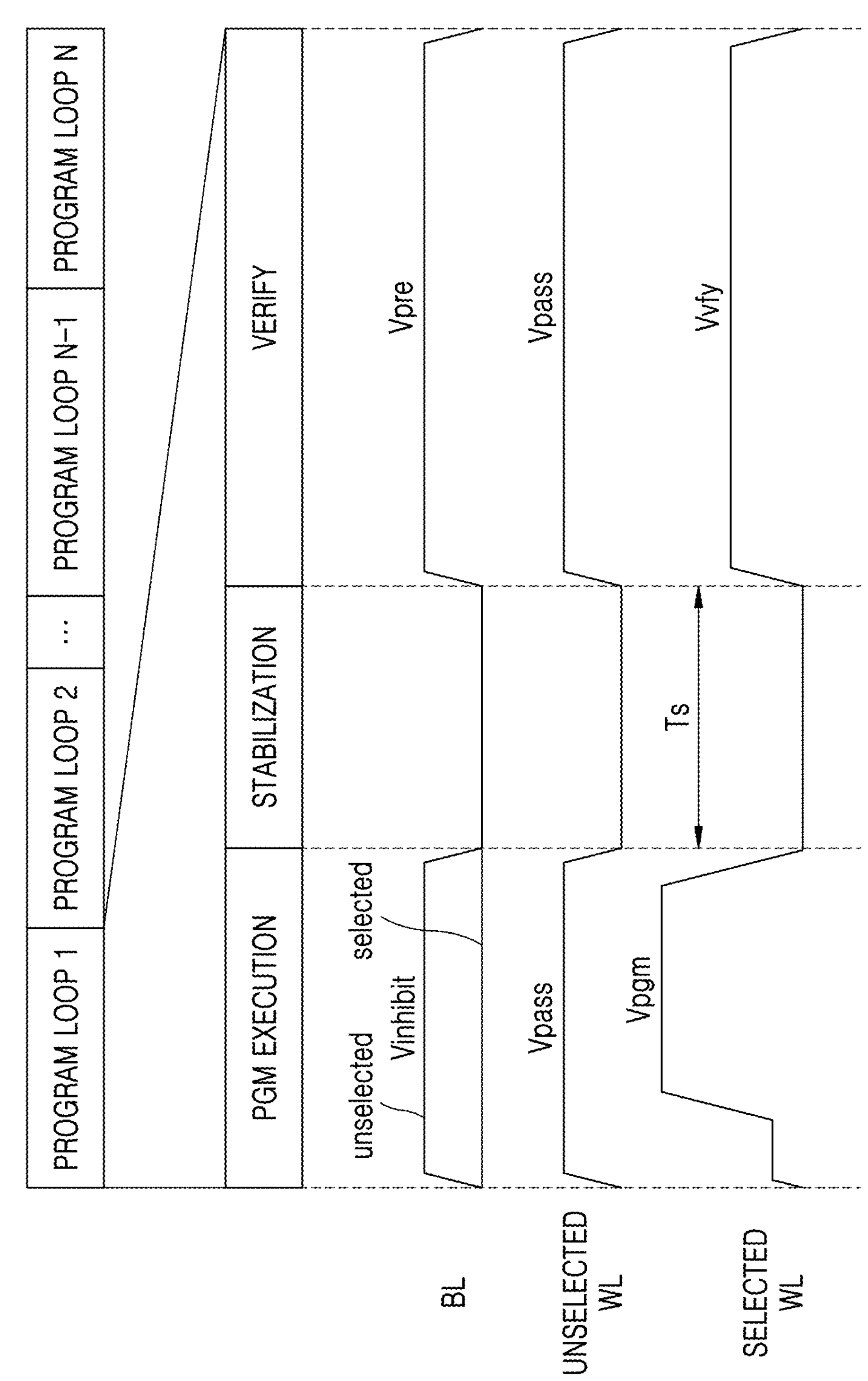
FIG. 10 is a diagram illustrating a method of programming a memory device, according to an embodiment.

FIG. 10 is a diagram illustrating a method of programming a memory device, according to an embodiment. FIG. 10 may be described with reference to FIG. 9.

Referring to FIG. 10, first to Nth program loops (hereafter, program loop 1 to program loop N) may be performed during a program operation. Hereinafter, the description of program loop 1 may be applied to the remaining program loops.

The program loop 1 may include a program execution period (PGM EXECUTION), a stabilization period (STABILIZATION), and a verification period (VERIFY).

In the program execution period, a voltage of the selected bit line, e.g., the second bit line BL2, may be maintained at an initial voltage, and the unselected bit line, e.g., the first bit line BL1, may be precharged to a program inhibition voltage Vinhibit. The voltage applied to the selected bit line may be referred to as a program permission voltage.

In the program execution period, a pass voltage Vpass may be applied to the unselected word line, and the program voltage Vpgm may be applied to the selected word line. A channel of the first string ST1 may be self-boosted, and the memory cells of the first string ST1 may not be programmed. The selected memory cell included in the second string ST2 may be programmed by the program voltage Vpgm applied to the selected word line.

When the program execution period ends, voltages of the bit lines BL and the word lines WL may be recovered to the initial voltage. In other words, the voltages of the bit lines BL and the word lines WL may drop.

In the stabilization period, the voltages of the bit lines BL and the word lines WL may be maintained at the initial voltage for a stabilization time Ts.

In the stabilization period, as illustrated in FIG. 8, the program state P of the selected memory cell may move to a lower threshold voltage state compared to the erase state E.

In the verification period, the selected bit line and the unselected bit line may be precharged to a precharge voltage Vpre, the pass voltage Vpass may be applied to the unselected word line again, and the verification voltage Vvfy may be applied to the selected word line. In the verification period, the page buffer circuit 210 may verify whether the memory cell MC is programmed into the stable program state P. If the verification passes, the program inhibition voltage Vinhibit may be applied to the second bit line BL during a program execution period of a next program loop.

Figure 11:
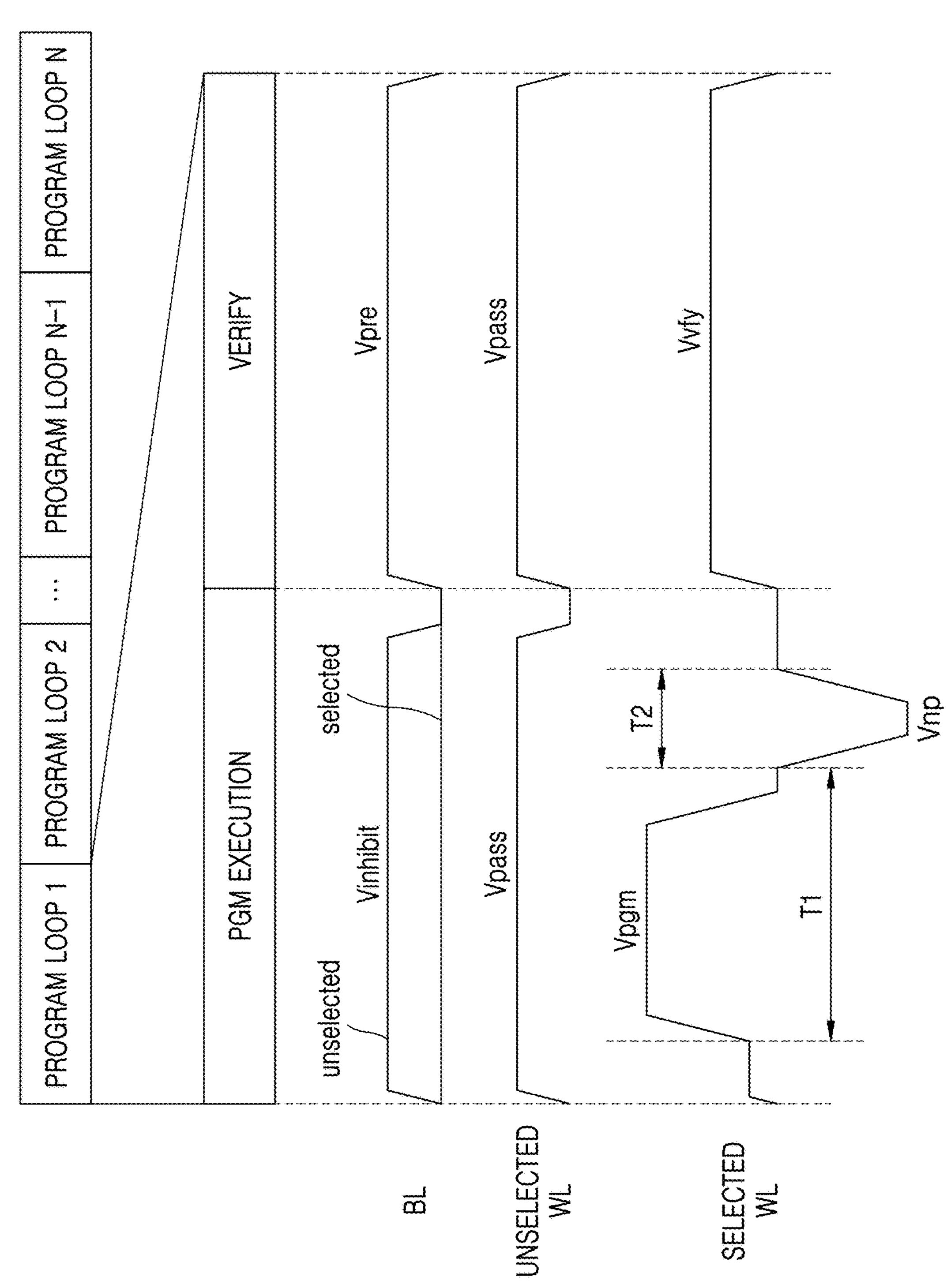
FIG. 11 is a diagram illustrating a method of programming a memory device, according to an embodiment.

FIG. 11 is a diagram illustrating a method of programming a memory device, according to an embodiment. FIG. 11 may be described with reference to FIG. 9.

Referring to FIG. 11, program loop 1 to program loop N may be performed during a program operation. Hereinafter, the description of the program loop 1 may be applied to the remaining program loops.

The program loop 1 may include a program execution period and a verification period. The program loop 1 may not include a stabilization period.

The description of the voltages applied to the bit lines and the unselected word lines in the program execution period is the same as that of FIG. 10 and may thus be omitted.

The program voltage Vpgm and a negative pulse voltage Vnp may be sequentially applied to the selected word line. For example, during a first time period T1, the program voltage Vpgm having a positive level may be applied to the selected word line. During a second time period T2 following the first time period T1, a negative pulse voltage Vnp may be applied to the selected word line. The negative pulse voltage Vnp may be a pulse voltage with a negative level. As illustrated in FIG. 8, right after the program voltage Vpgm is applied, an unstable program state P may be formed due to the excessive trap charges. When the negative pulse voltage Vnp is applied, because the excessive trap charges are detrapped, a stable program state P may be formed. The second time period T2 may be referred to as a pulse time, and the pulse time may be shorter than the stabilization time Ts of FIG. 10.

When the program execution period ends, voltages of the bit lines BL and the word lines WL may be recovered to the initial voltage. In other words, voltage levels of the bit lines BL and the word lines WL may be initialized.

The description of the voltages applied to the bit lines and the word lines in the verification period is the same as that of FIG. 10 and may thus be omitted.

Figure 12:
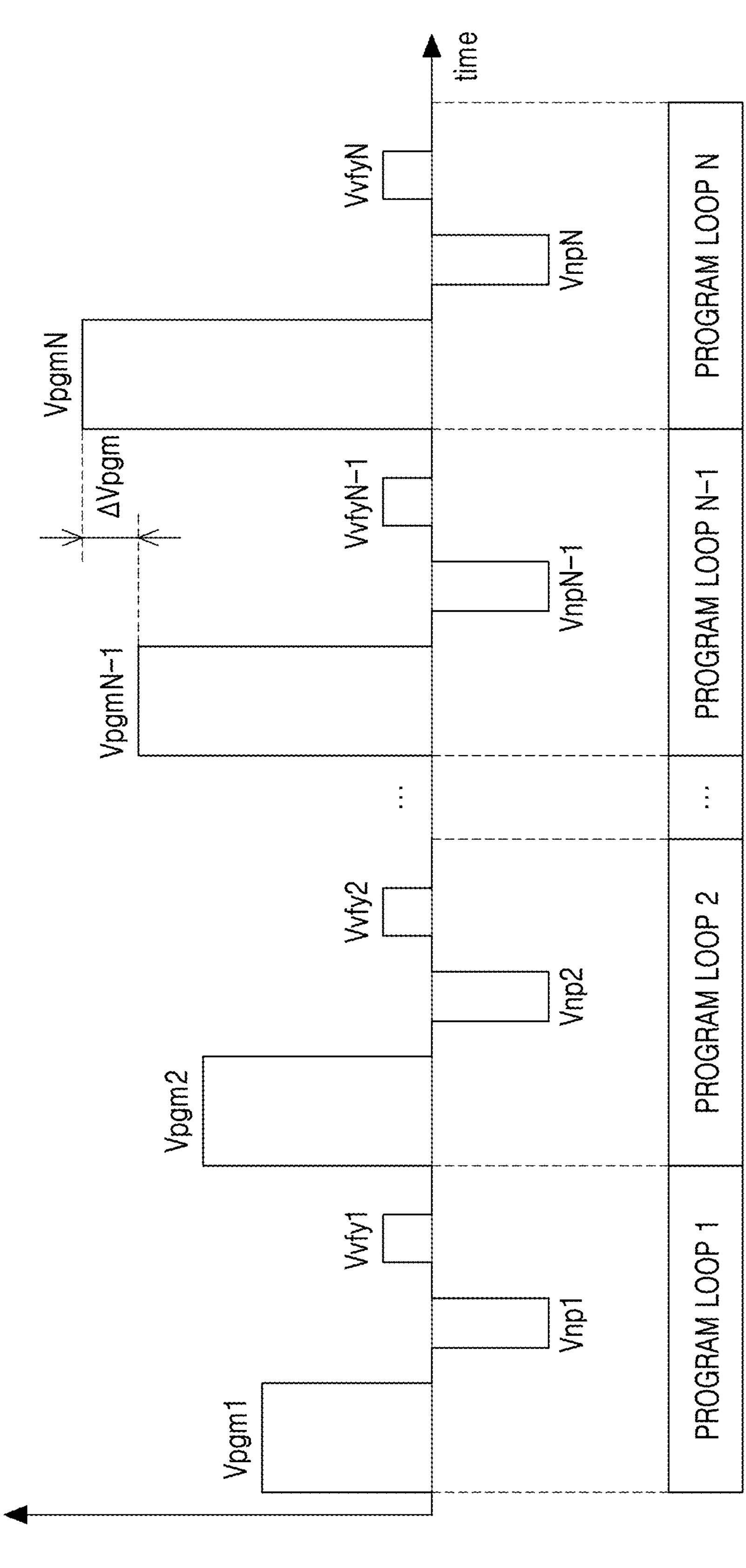
FIG. 12 is a timing diagram illustrating a voltage applied to a selected word line during a program operation according to an embodiment.

FIG. 12 is a timing diagram illustrating a voltage applied to a selected word line during a program operation according to an embodiment.

Referring to FIG. 12, as described above with reference to FIG. 11, each of program loop 1 to program loop N may include a program execution period and a verification period. Memory cells may be programmed by using the ISPP scheme. In other words, as the program loops progress, the program voltage may gradually increase. For example, the program voltage applied in a next program loop may have a voltage level increased by ΔVpgm compared to the program voltage applied in a previous program loop.

In each program loop, the pulse voltage may be applied after the program voltage is applied to the selected word line. The pulse voltage may have a negative voltage level. For example, in the program loop 1, after a first program voltage Vpgm1 is applied to the selected word line, a first pulse voltage Vnp1 may be applied. In the program loop 2, after a second program voltage Vpgm2 is applied to the selected word line, a second pulse voltage Vnp2 may be applied. In the program loop N−1, after an N−1th program voltage VpgmN−1 is applied to the selected word line, an N−1th pulse voltage VnpN−1 may be applied. In the program loop N, after an Nth program voltage VpgmN is applied to the selected word line, an Nth pulse voltage VnpN may be applied.

In an embodiment, voltage levels of the first to Nth pulse voltages Vnp1 to VnpN may be the same. In addition, pulse times for which the first to Nth pulse voltages Vnp1 to VnpN are applied may be the same. However, the embodiment is not limited thereto, and voltage levels of some of the first to Nth pulse voltages Vnp1 to VnpN may be different from one another. In addition, pulse times for applying some of the first to Nth pulse voltages Vnp1 to VnpN may be different from one another.

The verification voltage may be applied to the selected word line in the verification period of each program loop. For example, in the verification period of the program loop 1, a first verification voltage Vvfy1 may be applied to the selected word line. In the verification period of the program loop 2, a second verification voltage Vvfy2 may be applied to the selected word line. In the verification period of the N−1th program loop program loop N−1, an N−1th verification voltage VvfyN−1 may be applied to the selected word line. In the verification period of the program loop N, an Nth verification voltage VvfyN may be applied to the selected word line.

Because pulse voltages of the same voltage level are applied to the plurality of program loops, the design complexity associated with changing the voltage levels of the pulse voltages may be reduced.

Figure 13:
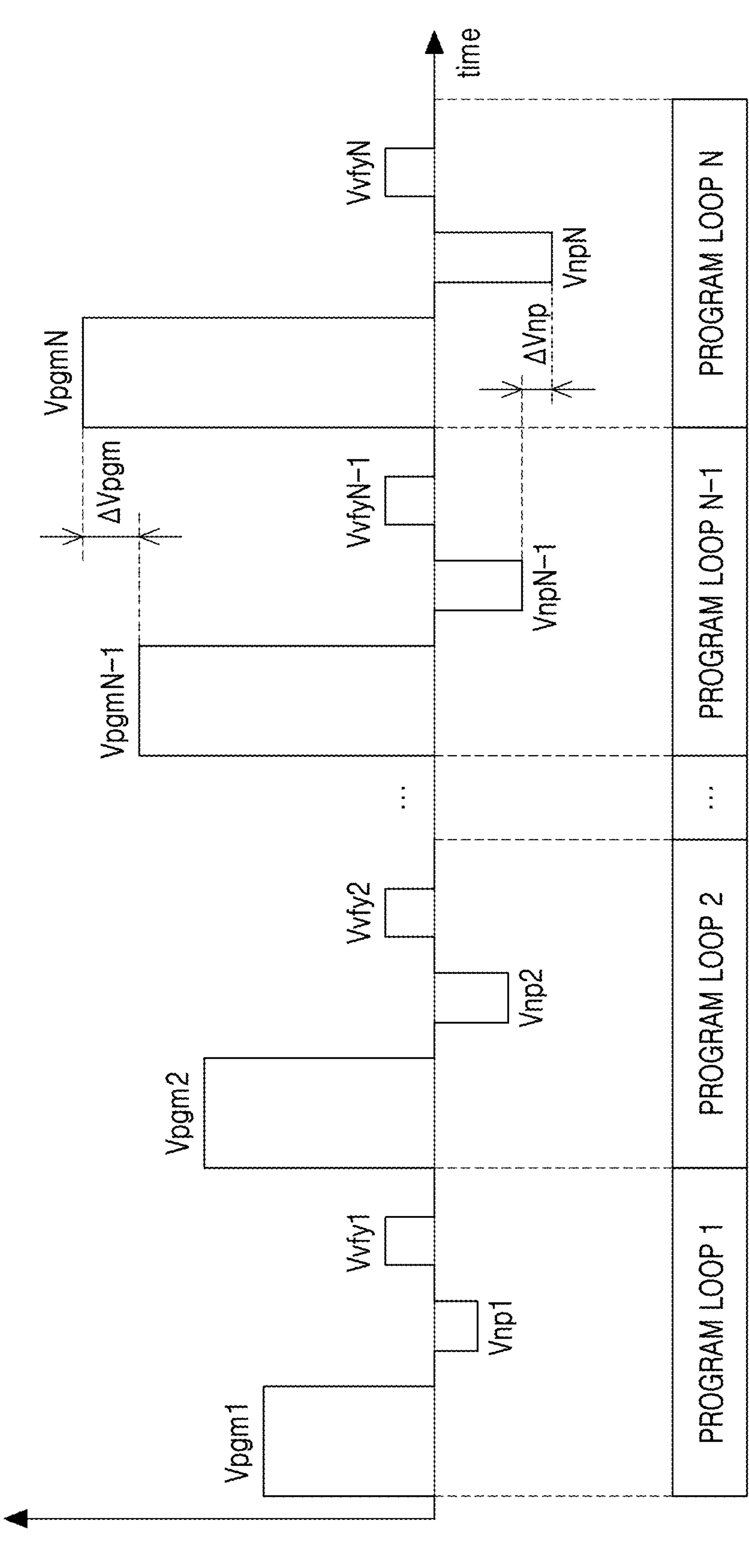
FIG. 13 is a timing diagram illustrating a voltage applied to a selected word line during a program operation according to an embodiment.

FIG. 13 is a timing diagram illustrating a voltage applied to a selected word line during a program operation according to an embodiment. Descriptions overlapping those previously given with reference to FIG. 12 may be omitted.

Referring to FIG. 13, voltage levels of the first to Nth pulse voltages Vnp1 to VnpN may be gradually reduced. For example, the pulse voltage applied in a next program loop may have a voltage level reduced by ΔVnp compared to the pulse voltage applied in a previous program loop. For example, the second pulse voltage Vnp2 may have a voltage level reduced by ΔVnp from the first pulse voltage Vnp1, and the Nth pulse voltage VnpN may have a voltage level reduced by ΔVnp from the N−1th pulse voltage VnpN−1.

Referring to FIG. 6B, when a relatively high program voltage is applied to the selected word line, the amount of excessive trap charges formed between the ferroelectric layer FL and the blocking insulation layer BI after the program voltage is applied may increase. Therefore, according to the embodiment, in a program loop in which a relatively high program voltage is used, a program speed may be increased by releasing the excessive trap charges based on a negative pulse voltage having a relatively large magnitude.

However, the embodiment is not limited thereto, and voltage levels of some of the first to Nth pulse voltages Vnp1 to VnpN may be the same.

Figure 14:
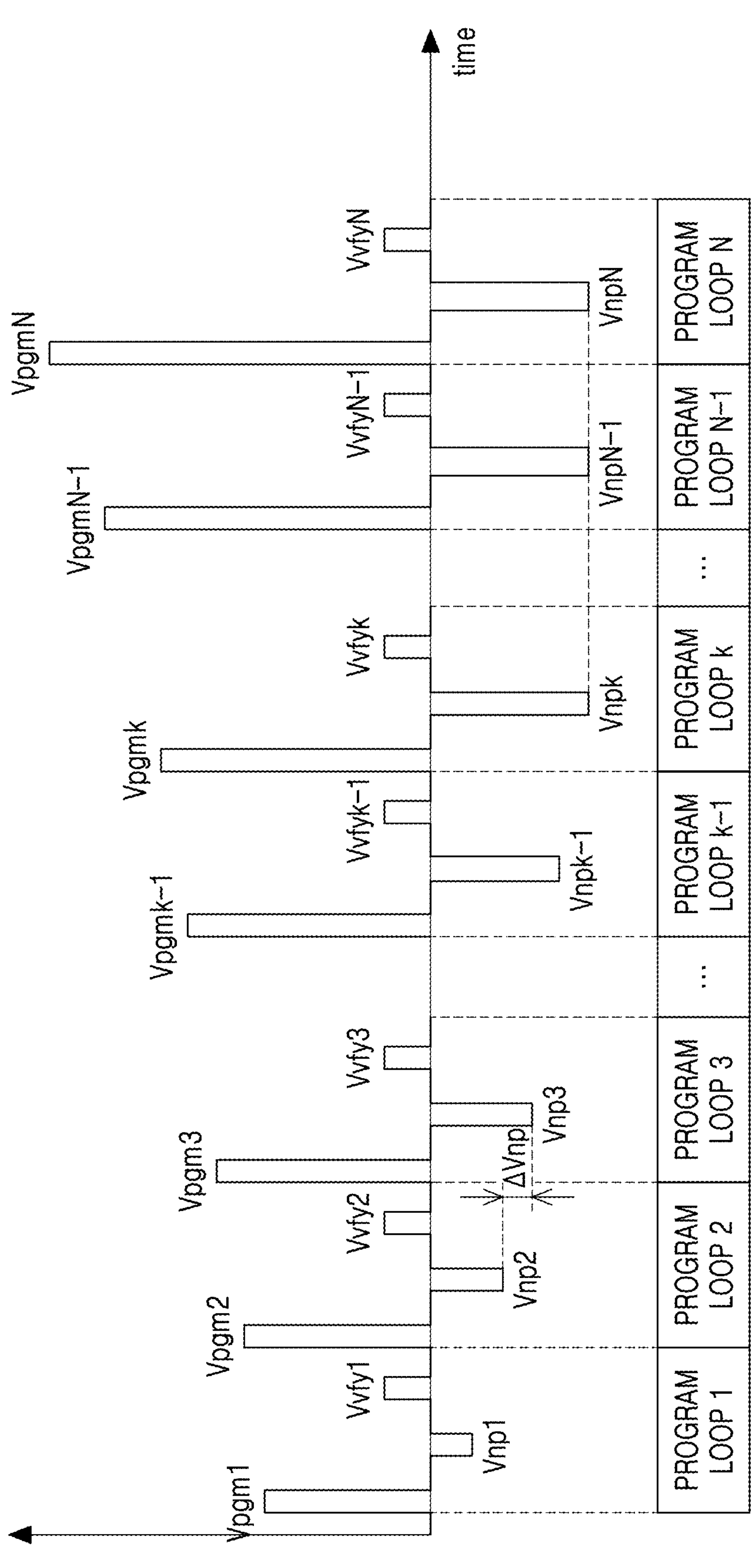
FIG. 14 is a timing diagram illustrating a voltage applied to a selected word line during a program operation according to an embodiment.

FIG. 14 is a timing diagram illustrating a voltage applied to a selected word line during a program operation according to an embodiment. Descriptions overlapping those previously given with reference to FIGS. 12 and 13 may be omitted.

Referring to FIG. 14, in first to kth pulse voltages Vnp1 to Vnpk, a voltage level of a pulse voltage may be gradually reduced by ΔVnp. For example, a voltage level of the third pulse voltage Vnp3 may be lower than a voltage level of the second pulse voltage Vnp2 by ΔVnp. The first to kth pulse voltages Vnp1 to Vnpk may be applied during first to kth program loops.

In kth to Nth pulse voltages Vnpk to VnpN, a voltage level of a pulse voltage may remain the same. For example, the voltage levels of the kth pulse voltage Vnpk, the N−1th pulse voltage VnpN−1, and the Nth pulse voltage VnpN may be the same. The kth to Nth pulse voltages Vnpk to VnpN may be applied during kth th Nth program loops.

Due to ferroelectric characteristics, when the voltage applied to the gate electrode GE exceeds a certain level, a degree of polarization may be saturated. Therefore, by maintaining the voltage level of the pulse voltage constant from a program voltage with a reference level or from a preset program loop, it is possible to decrease the time required to drive the word line using the pulse voltage and to prevent excessive power consumption in generating the pulse voltage.

Figure 15:
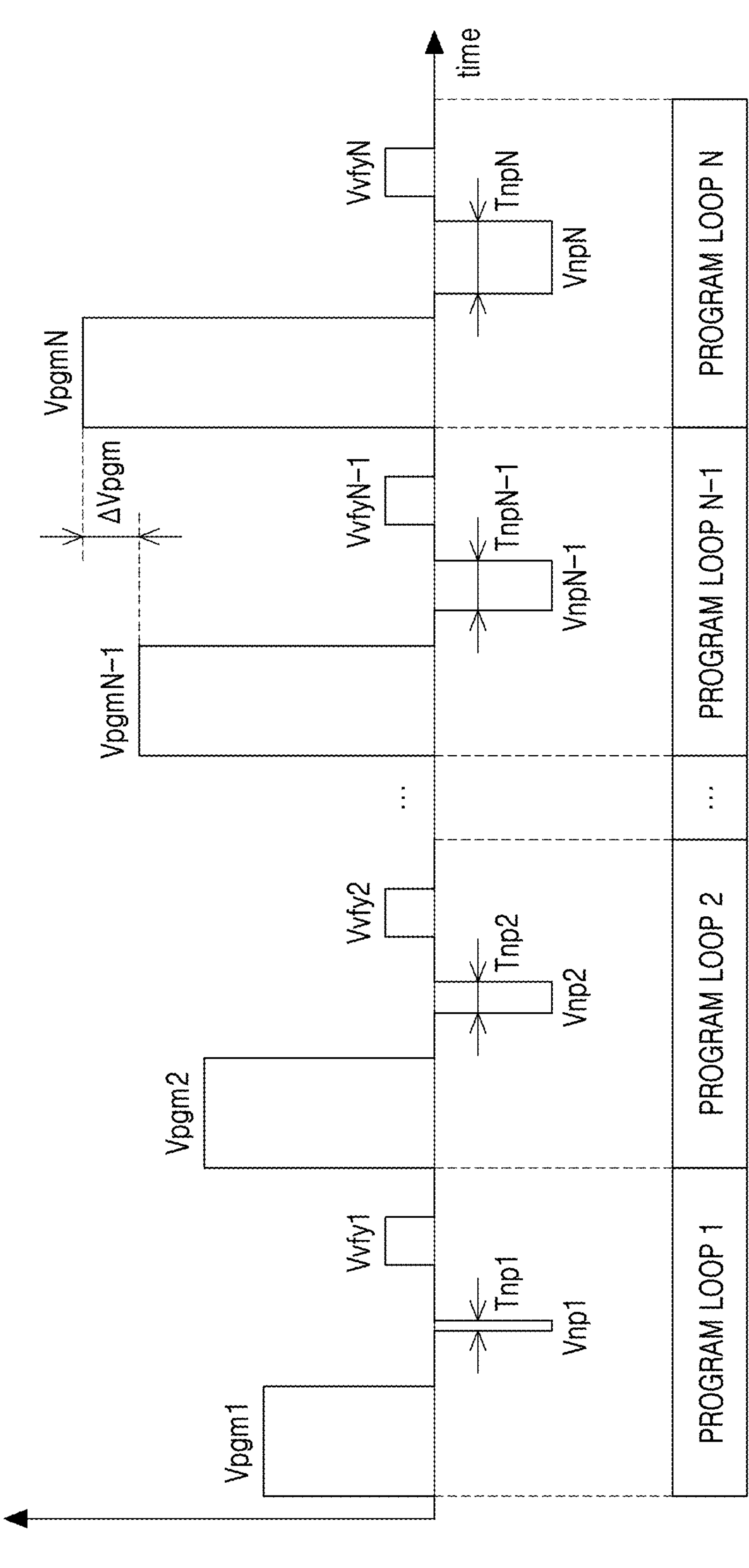
FIG. 15 is a timing diagram illustrating a voltage applied to a selected word line during a program operation according to an embodiment.

FIG. 15 is a timing diagram illustrating a voltage applied to a selected word line during a program operation according to an embodiment. Descriptions overlapping those previously given with reference to FIGS. 12 and 13 may be omitted.

Referring to FIG. 15, pulse widths of the first to Nth pulse voltages Vnp1 to VnpN may be gradually increased. For example, a pulse width of a pulse voltage applied in a next program loop may be greater than a pulse width of a pulse voltage applied in a previous program loop. For example, a pulse width Tnp2 of the second pulse voltage Vnp2 may be greater than a pulse width Tnp1 of the first pulse voltage Vnp1, and a pulse width TnpN of the Nth pulse voltage VnpN may be greater than a pulse width TnpN−1 of the N−1th pulse voltage VnpN−1. In addition, pulse width TnpN−1 of the N−1th pulse voltage VnpN−1 may be greater than the pulse width Tnp2 of the second pulse voltage Vnp2.

Referring to FIG. 6B, when a relatively high program voltage is applied to the selected word line, the amount of excessive trap charges formed between the ferroelectric layer FL and the blocking insulation layer BI after the program voltage is applied may increase. Therefore, according to the embodiment, in a program loop in which a relatively high program voltage is used, a program speed may be increased by releasing the excessive trap charges based on a negative pulse voltage having a relatively large pulse width.

However, the embodiment is not limited thereto, and pulse widths of some of the first to Nth pulse voltages Vnp1 to VnpN may be the same.

Figure 16:
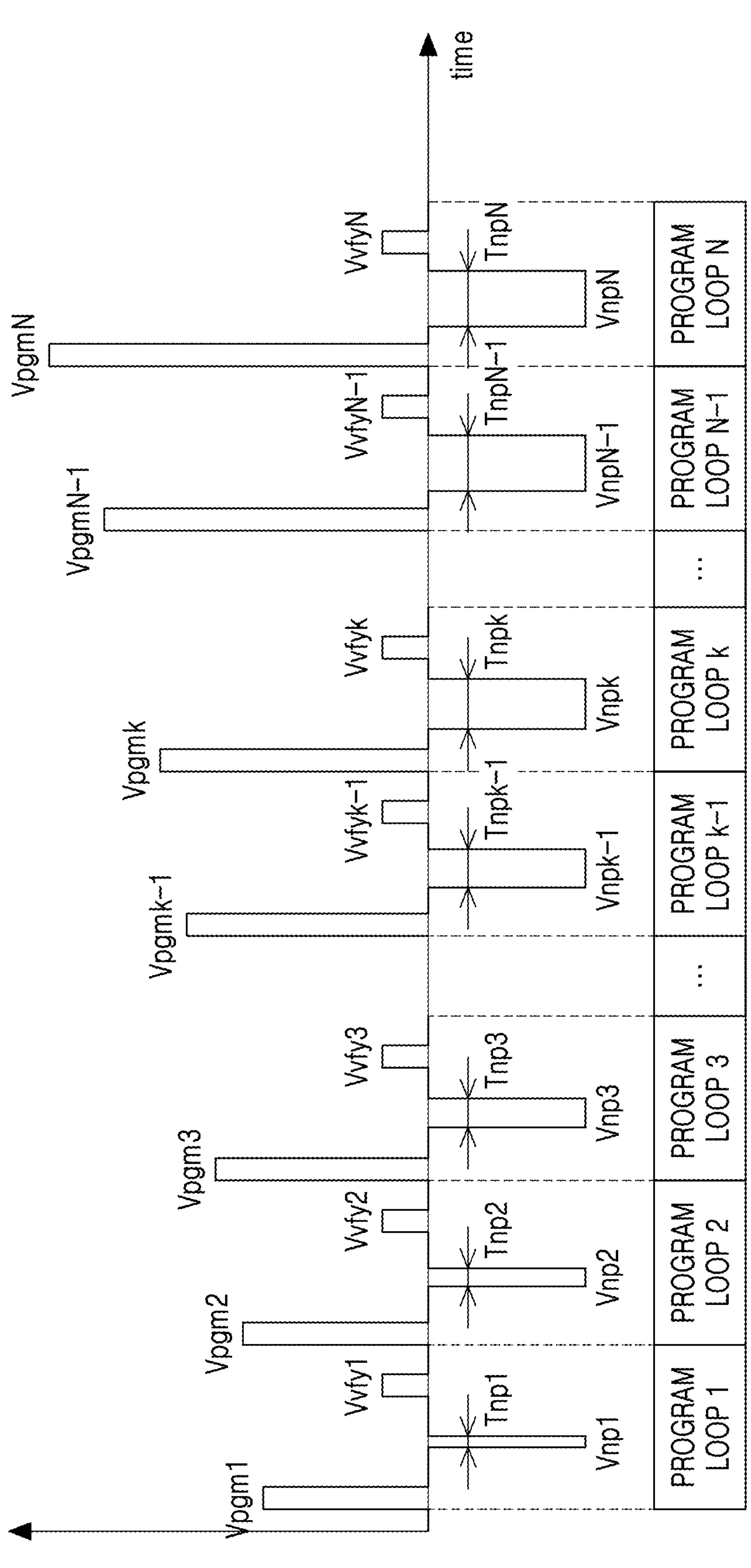
FIG. 16 is a timing diagram illustrating a voltage applied to a selected word line during a program operation according to an embodiment.

FIG. 16 is a timing diagram illustrating a voltage applied to a selected word line during a program operation according to an embodiment. Descriptions overlapping those previously given with reference to FIG. 15 may be omitted.

Referring to FIG. 16, pulse widths of the first to Nth pulse voltages Vnp1 to VnpN may be gradually increased. For example, a pulse width of a pulse voltage applied in a next program loop may be greater than a pulse width of a pulse voltage applied in a previous program loop. For example, the pulse width Tnp2 of the second pulse voltage Vnp2 may be greater than the pulse width Tnp1 of the first pulse voltage Vnp1. In addition, a pulse width Tnpk of the kth pulse voltage Vnpk may be greater than a pulse width Tnpk−1 of the k−1th pulse voltage Vnpk-1.

In kth to Nth pulse voltages Vnpk to VnpN, following the first to k−1th pulse voltages, a pulse width of a pulse voltage may remain the same. For example, the pulse width Tnpk of the kth pulse voltage Vnpk, the pulse width TnpN−1 of the N−1th pulse voltage VnpN−1, and the pulse width TnpN of the Nth pulse voltage VnpN may be the same.

Due to ferroelectric characteristics, when the voltage applied to the gate electrode GE exceeds a certain level, a degree of polarization may be saturated. Accordingly, a length of the program loop may be shortened by keeping the pulse width of the pulse voltage constant from the program voltage that has the reference level or is part of the preset program loop.

Figure 17:
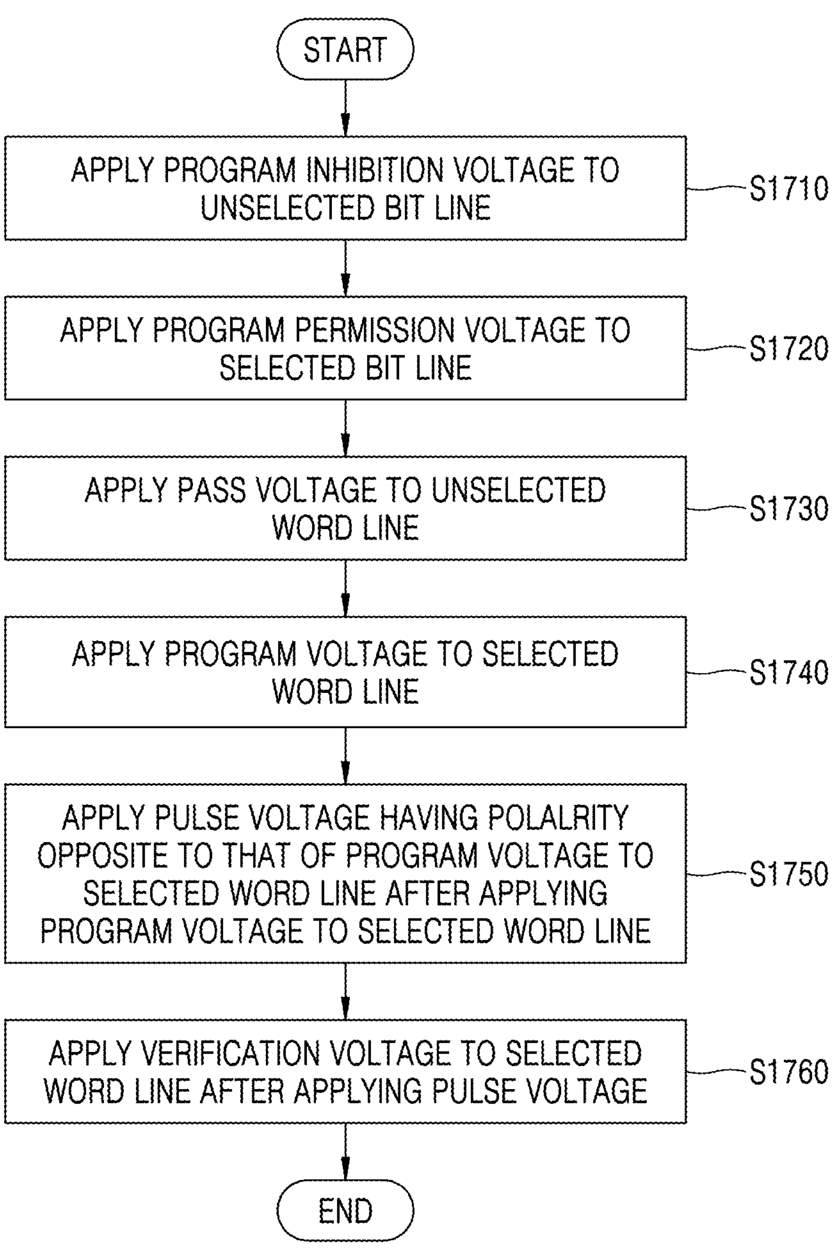
FIG. 17 is a flowchart illustrating a method of programming a memory device, according to an embodiment.

FIG. 17 is a flowchart illustrating a method of programming a memory device, according to an embodiment. FIG. 17 may be described with reference to FIGS. 1 and 11.

Referring to FIG. 17, the memory device 10 may apply a program inhibition voltage to the unselected bit line in operation S1710. For example, the memory device 10 may apply the program inhibition voltage to the unselected bit line during the first time period and the second time period in each program loop.

The memory device 10 may apply a program permission voltage to the selected bit line in operation S1720. For example, the memory device 10 may apply the program permission voltage to the selected bit line during the first time period and the second time period in each program loop.

The memory device 10 may apply the pass voltage to an unselected word line in operation S1730. The pass voltage may have a voltage level higher than a threshold voltage of a memory cell programmed to an arbitrary state.

The memory device 10 may apply the program voltage to the selected word line in operation S1740. For example, the memory device 10 may apply the program voltage to a word line selected in each program loop. The program voltage may have a positive level. However, the embodiment is not limited thereto, and the program voltage may have a negative level. The memory device 10 may apply program voltages that gradually increase in a plurality of program loops to the selected word line. In some embodiments, the memory device 10 may apply a program voltage to the selected word line, the program voltage gradually increasing until a reference program loop. In addition, the memory device 10 may apply a program voltage at a constant level to the selected word line after the reference program loop.

The memory device 10 may apply a pulse voltage having a polarity opposite to that of the program voltage to the selected word line after applying the program voltage to the selected word line in operation S1750. For example, the memory device 10 may apply a pulse voltage to the selected word line after applying a program voltage to each program-selected word line. For example, the pulse voltage may have a negative level. However, the embodiment is not limited thereto, and the pulse voltage may have a positive level. In some embodiments, the memory device 10 may apply a pulse voltage to the selected word line, where the magnitude of the pulse voltage gradually increases in a negative direction across multiple program loops. In some embodiments, the memory device 10 may apply a pulse voltage to the selected word line, where the magnitude of the pulse voltage gradually increases in the negative direction until reaching a reference program loop, and then apply a pulse voltage at a constant level to the selected word line after the reference program loop. In some embodiments, the memory device 10 may apply a pulse voltage to the selected word line, where the pulse width gradually increases across multiple program loops. In some embodiments, the memory device 10 may apply the pulse voltage to the selected word line, where the pulse width gradually increases until the reference program loop is reached, and then apply a pulse voltage with a constant pulse width to the selected word line after the reference program loop.

The memory device 10 may apply the verification voltage to the selected word line after applying the pulse voltage to the selected word line in operation S1760.

Figure 18:
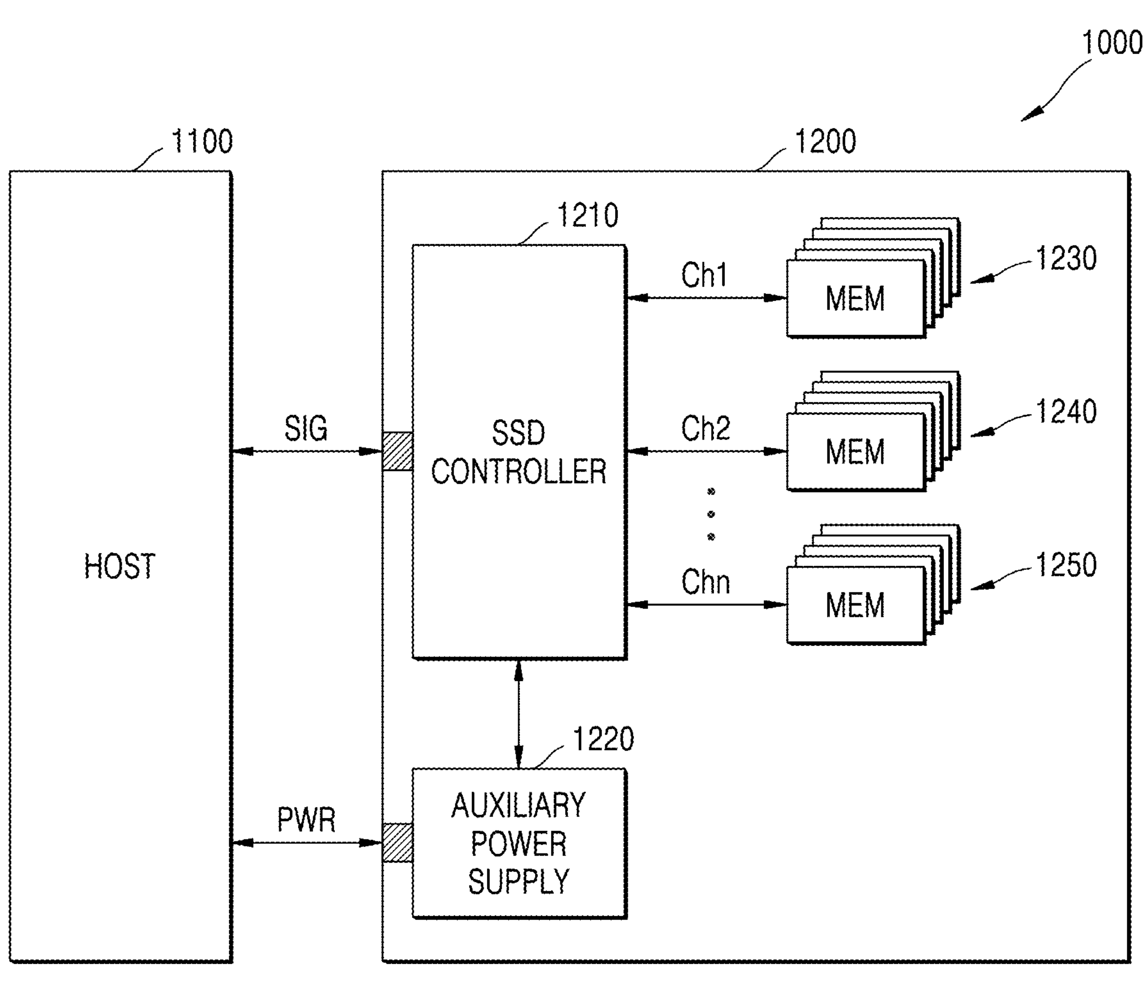
FIG. 18 is a block diagram illustrating an example in which a memory system according to embodiments is applied to a solid state drive (SSD) system.

FIG. 18 is a block diagram illustrating an example in which a memory system according to embodiments is applied to a solid state drive (SSD) system 1000.

Referring to FIG. 18, the SSD system 1000 may include a host 1100 and an SSD 1200. The SSD 1200 exchanges a signal SIG with the host 1100 through a signal connector and receives power PWR through a power connector. The SSD 1200 may include an SSD controller 1210, an auxiliary power supply 1220, and memory devices 1230, 1240, and 1250. The memory devices 1230, 1240, and 1250 may be connected to the SSD controller 1210 through channels Ch1, Ch2, and Chn, respectively.

The memory devices 1230, 1240, and 1250 may be implemented by using the memory devices 10 and 10' described above with reference to FIGS. 1 to 17. For example, each of the memory devices 1230, 1240, and 1250 may apply the pulse voltage having a polarity opposite to that of the program voltage to the selected word line after applying the program voltage to the selected word line during the program operation.

Figure 19:
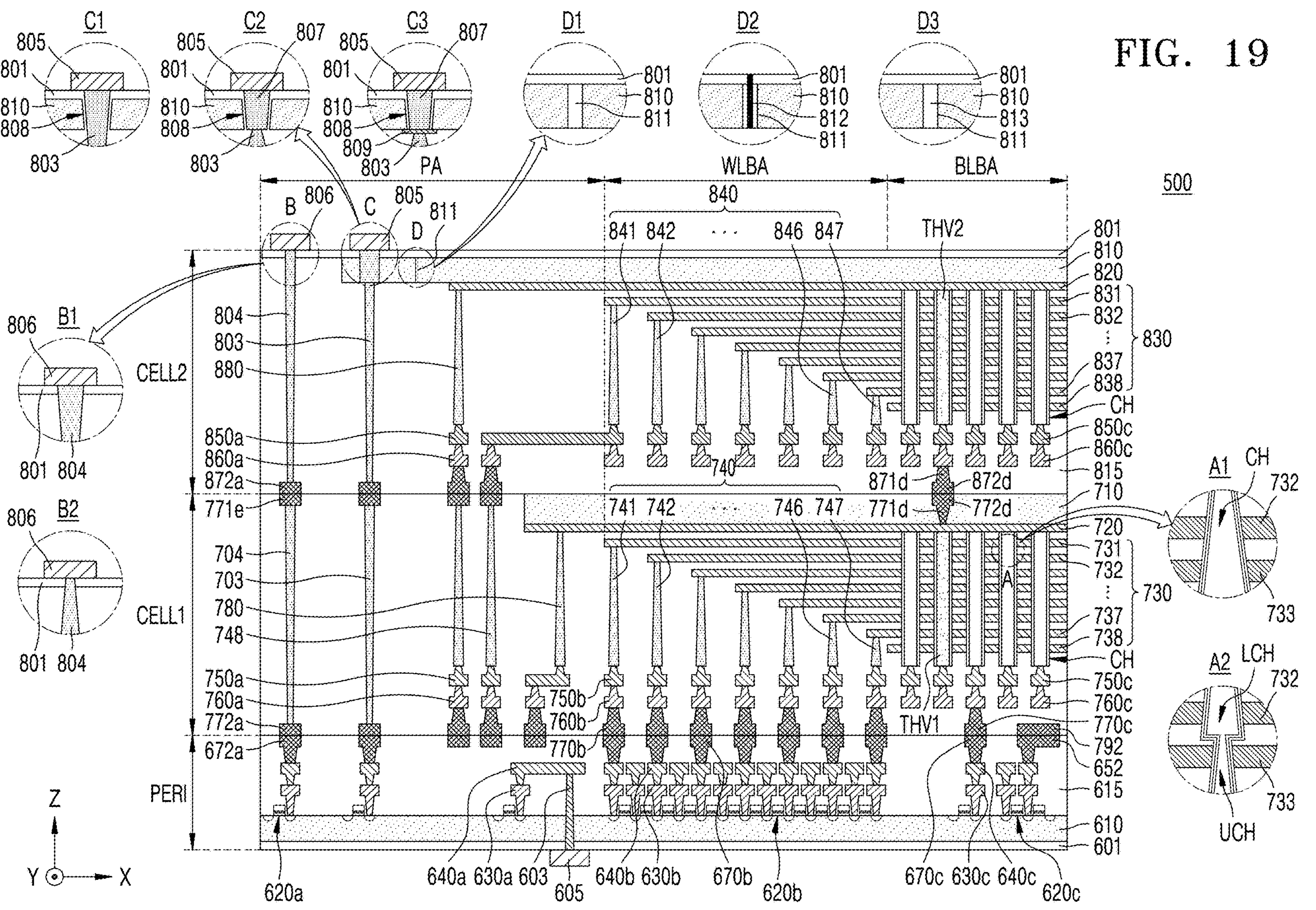
FIG. 19 is a diagram illustrating a memory device according to an embodiment.

FIG. 19 is a view illustrating a memory device 500 according to some embodiments of the inventive concept.

Referring to FIG. 19, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may be a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 19, the memory device 500 may include two upper chips. However, the number of upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip, and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 19. However, embodiments of the inventive concept are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 610 and a plurality of circuit elements 620*a*, 620*b*, and 620*c* formed on the first substrate 610. An interlayer insulating layer 615 including one or more insulating layers may be provided on the plurality of circuit elements 620*a*, 620*b*, and 620*c*, and a plurality of metal lines electrically connected to the plurality of circuit elements 620*a*, 620*b*, and 620*c* may be provided in the interlayer insulating layer 615. For example, the plurality of metal lines may include first metal lines 630*a*, 630*b* and 630*c* connected to the plurality of circuit elements 620*a*, 620*b*, and 620*c*, and second metal lines 640*a*, 640*b*, and 640*c* formed on the first metal lines 630*a*, 630*b*, and 630*c*. The plurality of metal lines may be formed of at least one of various conductive materials. For example, the first metal lines 630*a*, 630*b*, and 630*c* may be formed of tungsten having a relatively high electrical resistivity, and the second metal lines 640*a*, 640*b*, and 640*c* may be formed of copper having a relatively low electrical resistivity.

The first metal lines 630*a*, 630*b*, and 630*c* and the second metal lines 640*a*, 640*b*, and 640*c* are illustrated and described in the present embodiments. However, embodiments of the inventive concept are not limited thereto. In certain embodiments, at least one or more additional metal lines may further be formed on the second metal lines 640*a*, 640*b*, and 640*c*. In this case, the second metal lines 640*a*, 640*b*, and 640*c* may be formed of aluminum, and at least some of the additional metal lines formed on the second metal lines 640*a*, 640*b*, and 640*c* may be formed of copper having an electrical resistivity lower than that of the aluminum of the second metal lines 640*a*, 640*b*, and 640*c*.

The interlayer insulating layer 615 may be disposed on the first substrate 610 and may include an insulating material such as silicon oxide and/or silicon nitride.

Each of the first and second cell regions CELL1 and CELL2 may include at least one memory block. The first cell region CELL1 may include a second substrate 710 and a common source line 720. A plurality of word lines 730 (731, 732, 733, 734, 735, 736, 737 and 738) may be stacked on the second substrate 710 in a direction (e.g., the Z-axis direction) perpendicular to a top surface of the second substrate 710. String selection lines and a ground selection line may be disposed on and under the word lines 730, and the plurality of word lines 730 may be disposed between the string selection lines and the ground selection line. Likewise, the second cell region CELL2 may include a third substrate 810 and a common source line 820, and a plurality of word lines 830 (831, 832, 833, 834, 835, 836, 837 and 838) may be stacked on the third substrate 810 in a direction (e.g., the Z-axis direction) perpendicular to a top surface of the third substrate 810. Each of the second substrate 710 and the third substrate 810 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 710 to penetrate the word lines 730, the string selection lines, and the ground selection line. The channel structure CH may include a data storage layer, a channel layer, and a filling insulation layer. The channel layer may be electrically connected to a first metal line 750*c* and a second metal line 760*c* in the bit line bonding region BLBA. For example, the second metal line 760*c* may be a bit line and may be connected to the channel structure CH through the first metal line 750*c*. The bit line 760*c* may extend in a first direction (e.g., a Y-axis direction) parallel to the top surface of the second substrate 710. The description for the first metal line 750*c* may be applied to a first metal line 850*c* and the description for the second metal line 760*c* may be applied to a second metal line 860*c*.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 710 to penetrate the common source line 720 and lower word lines 731 and 732. The lower channel LCH may include a data storage layer, a channel layer, and a filling insulation layer and may be connected to the upper channel UCH. The upper channel UCH may penetrate upper word lines 733 to 738. The upper channel UCH may include a data storage layer, a channel layer, and a filling insulation layer, and the channel layer of the upper channel UCH may be electrically connected to the first metal line 750*c* and the second metal line 760*c*. As a length of a channel increases, due to characteristics of manufacturing processes, make it challenging to form a channel with a substantially uniform width. The memory device 500 according to the present embodiments may include a channel having improved width uniformity due to the lower channel LCH and the upper channel UCH which are formed by the sequentially performed processes.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 732 and 733 adjacent to the boundary between the lower channel LCH and the upper channel UCH may be the dummy word lines. In this case, data may not be stored in memory cells connected to the dummy word lines. Alternatively, the number of pages corresponding to the memory cells connected to the dummy word lines may be less than the number of pages corresponding to the memory cells connected to a general word line. A level of a voltage applied to the dummy word lines may be different from a level of a voltage applied to the general word line, and thus it is possible to reduce an influence of a non-uniform channel width between the lower and upper channels LCH and UCH on an operation of the memory device.

In addition, the number of lower word lines (e.g., 731 and 732) penetrated by the lower channel LCH is less than the number of upper word lines (e.g., 733 to 738) penetrated by the upper channel UCH in the region 'A2'. However, embodiments of the inventive concept are not limited thereto. In certain embodiments, the number of lower word lines penetrated by the lower channel LCH may be equal to or more than the number of upper word lines penetrated by the upper channel UCH. In addition, structural features and the connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1 and a second through-electrode THV2 may be provided in the second cell region CELL2. As illustrated in FIG. 19, the first through-electrode THV1 may penetrate the common source line 720 and the plurality of word lines 730. In certain embodiments, the first through-electrode THV1 may further penetrate the second substrate 710. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 772*d* and a second through-metal pattern 872*d*. The first through-metal pattern 772*d* may be formed at a bottom end of the first upper chip including the first cell region CELL1, and the second through-metal pattern 872*d* may be formed at a top end of the second upper chip including the second cell region CELL2. The first through-electrode THV1 may be electrically connected to the first metal line 750*c* and the second metal line 760*c*. A lower via 771*d* may be formed between the first through-electrode THV1 and the first through-metal pattern 772*d*, and an upper via 871*d* may be formed between the second through-electrode THV2 and the second through-metal pattern 872*d*. The first through-metal pattern 772*d* and the second through-metal pattern 872*d* may be connected to each other by the bonding method. For example, the first and second through-metal patterns 772*d* and 872*d* may be in direct contact with each other.

In addition, in the bit line bonding region BLBA, an upper metal pattern 652 may be formed in an uppermost metal layer of the peripheral circuit region PERI, and an upper metal pattern 792 having the same shape as the upper metal pattern 652 may be formed in an uppermost metal layer of the first cell region CELL1. The upper metal pattern 792 of the first cell region CELL1 and the upper metal pattern 652 of the peripheral circuit region PERI may be electrically connected to each other by the bonding method. For example, the upper metal patterns 792 and 652 may be in direct contact with each other. In the bit line bonding region BLBA, the bit line 760*c* may be electrically connected to a page buffer included in the peripheral circuit region PERI. For example, some of the circuit elements 620*c* of the peripheral circuit region PERI may constitute the page buffer, and the bit line 760*c* may be electrically connected to the circuit elements 620*c* constituting the page buffer through an upper bonding metal pattern 770*c* of the first cell region CELL1 and an upper bonding metal pattern 670*c* of the peripheral circuit region PERI.

Referring still to FIG. 19, in the word line bonding region WLBA, the word lines 730 of the first cell region CELL1 may extend in a second direction (e.g., an X-axis direction) parallel to the top surface of the second substrate 710 and may be connected to a plurality of cell contact plugs 740 (741, 742, 743, 744, 745, 746 and 747). First metal lines 750*b* and second metal lines 760*b* may be sequentially connected to the cell contact plugs 740 connected to the word lines 730. In the word line bonding region WLBA, the cell contact plugs 740 may be connected to the peripheral circuit region PERI through upper bonding metal patterns 770*b* of the first cell region CELL1 and upper bonding metal patterns 670*b* of the peripheral circuit region PERI.

The cell contact plugs 740 may be electrically connected to a row decoder included in the peripheral circuit region PERI. For example, some of the circuit elements 620*b* of the peripheral circuit region PERI may constitute the row decoder, and the cell contact plugs 740 may be electrically connected to the circuit elements 620*b* constituting the row decoder through the upper bonding metal patterns 770*b* of the first cell region CELL1 and the upper bonding metal patterns 670*b* of the peripheral circuit region PERI. In some embodiments, an operating voltage of the circuit elements 620*b* constituting the row decoder may be different from an operating voltage of the circuit elements 620*c* constituting the page buffer. For example, the operating voltage of the circuit elements 620*c* constituting the page buffer may be greater than the operating voltage of the circuit elements 620*b* constituting the row decoder.

In the word line bonding region WLBA, the word lines 830 of the second cell region CELL2 may extend in the second direction (e.g., the X-axis direction) parallel to the top surface of the third substrate 810 and may be connected to a plurality of cell contact plugs 840 (841, 842, 843, 844, 845, 846 and 847). The cell contact plugs 840 may be connected to the peripheral circuit region PERI through an upper metal pattern of the second cell region CELL2 and lower and upper metal patterns and a cell contact plug 748 of the first cell region CELL1.

In the word line bonding region WLBA, the upper bonding metal patterns 770*b* may be formed in the first cell region CELL1, and the upper bonding metal patterns 670*b* may be formed in the peripheral circuit region PERI. The upper bonding metal patterns 770*b* of the first cell region CELL1 and the upper bonding metal patterns 670*b* of the peripheral circuit region PERI may be electrically connected to each other by the bonding method. The upper bonding metal patterns 770*b* and the upper bonding metal patterns 670*b* may be formed of aluminum, copper, or tungsten.

In the external pad bonding region PA, a lower metal pattern 771*e* may be formed in a lower portion of the first cell region CELL1, and an upper metal pattern 872*a* may be formed in an upper portion of the second cell region CELL2. The lower metal pattern 771*e* of the first cell region CELL1 and the upper metal pattern 872*a* of the second cell region CELL2 may be connected to each other by the bonding method in the external pad bonding region PA. An upper metal pattern 772*a* may be formed in an upper portion of the first cell region CELL1, and an upper metal pattern 672*a* may be formed in an upper portion of the peripheral circuit region PERI. The upper metal pattern 772*a* of the first cell region CELL1 and the upper metal pattern 672*a* of the peripheral circuit region PERI may be connected to each other by the bonding method. For example, the upper metal patterns 772*a* and 672*a* may be directly connected to each other.

Common source line contact plugs 780 and 880 may be disposed in the external pad bonding region PA. The common source line contact plugs 780 and 880 may be formed of a conductive material such as a metal, a metal compound, and/or doped polysilicon. The common source line contact plug 780 of the first cell region CELL1 may be electrically connected to the common source line 720, and the common source line contact plug 880 of the second cell region CELL2 may be electrically connected to the common source line 820. A first metal line 750*a* and a second metal line 760*a* may be sequentially stacked on the common source line contact plug 780 of the first cell region CELL1, and a first metal line 850*a* and a second metal line 860*a* may be sequentially stacked on the common source line contact plug 880 of the second cell region CELL2.

Input/output pads 605, 805 and 806 may be disposed in the external pad bonding region PA. Referring to FIG. 19, a lower insulating layer 601 may cover a bottom surface of the first substrate 610, and a first input/output pad 605 may be formed on the lower insulating layer 601. The first input/output pad 605 may be connected to at least one of a plurality of the circuit elements 620*a* disposed in the peripheral circuit region PERI through a first input/output contact plug 603 and may be separated from the first substrate 610 by the lower insulating layer 601. In addition, a side insulating layer may be disposed between the first input/output contact plug 603 and the first substrate 610 to electrically isolate the first input/output contact plug 603 from the first substrate 610.

An upper insulating layer 801 covering a top surface of the third substrate 810 may be formed on the third substrate 810. A second input/output pad 805 and/or a third input/output pad 806 may be disposed on the upper insulating layer 801. The second input/output pad 805 may be connected to at least one of the plurality of circuit elements 620*a* disposed in the peripheral circuit region PERI through second input/output contact plugs 803 and 703, and the third input/output pad 806 may be connected to at least one of the plurality of circuit elements 620*a* disposed in the peripheral circuit region PERI through third input/output contact plugs 804 and 704.

In some embodiments, the third substrate 810 may not be disposed in a region in which the input/output contact plug is disposed. For example, as illustrated in a region 'B', the third input/output contact plug 804 may be separated from the third substrate 810 in a direction parallel to the top surface of the third substrate 810 and may penetrate an interlayer insulating layer 815 of the second cell region CELL2 to be connected to the third input/output pad 806. In this case, the third input/output contact plug 804 may be formed by at least one of various processes.

In some embodiments, as illustrated in a region 'B1', the third input/output contact plug 804 may extend in a third direction (e.g., the Z-axis direction), and a diameter of the third input/output contact plug 804 may become progressively larger toward the upper insulating layer 801. In other words, a diameter of the channel structure CH described in the region 'A1' may become progressively smaller toward the upper insulating layer 801, but the diameter of the third input/output contact plug 804 may become progressively larger toward the upper insulating layer 801. For example, the third input/output contact plug 804 may be formed after the second cell region CELL2 and the first cell region CELL1 are bonded to each other by the bonding method.

In certain embodiments, as illustrated in a region 'B2', the third input/output contact plug 804 may extend in the third direction (e.g., the Z-axis direction), and a diameter of the third input/output contact plug 804 may become progressively smaller toward the upper insulating layer 801. In other words, like the channel structure CH, the diameter of the third input/output contact plug 804 may become progressively smaller toward the upper insulating layer 801. For example, the third input/output contact plug 804 may be formed together with the cell contact plugs 840 before the second cell region CELL2 and the first cell region CELL1 are bonded to each other.

In certain embodiments, the input/output contact plug may overlap with the third substrate 810. For example, as illustrated in a region 'C', the second input/output contact plug 803 may penetrate the interlayer insulating layer 815 of the second cell region CELL2 in the third direction (e.g., the Z-axis direction) and may be electrically connected to the second input/output pad 805 through the third substrate 810. In this case, a connection structure of the second input/output contact plug 803 and the second input/output pad 805 may be realized by various methods.

In some embodiments, as illustrated in a region 'C1', an opening 808 may be formed to penetrate the third substrate 810, and the second input/output contact plug 803 may be connected directly to the second input/output pad 805 through the opening 808 formed in the third substrate 810. In this case, as illustrated in the region 'C1', a diameter of the second input/output contact plug 803 may become progressively larger toward the second input/output pad 805. However, embodiments of the inventive concept are not limited thereto, and in certain embodiments, the diameter of the second input/output contact plug 803 may become progressively smaller toward the second input/output pad 805.

In certain embodiments, as illustrated in a region 'C2', the opening 808 penetrating the third substrate 810 may be formed, and a contact 807 may be formed in the opening 808. An end of the contact 807 may be connected to the second input/output pad 805, and another end of the contact 807 may be connected to the second input/output contact plug 803. Thus, the second input/output contact plug 803 may be electrically connected to the second input/output pad 805 through the contact 807 in the opening 808. In this case, as illustrated in the region 'C2', a diameter of the contact 807 may become progressively larger toward the second input/output pad 805, and a diameter of the second input/output contact plug 803 may become progressively smaller toward the second input/output pad 805. For example, the second input/output contact plug 803 may be formed together with the cell contact plugs 840 before the second cell region CELL2 and the first cell region CELL1 are bonded to each other, and the contact 807 may be formed after the second cell region CELL2 and the first cell region CELL1 are bonded to each other.

In certain embodiments illustrated in a region 'C3', a stopper 809 may further be formed on a bottom end of the opening 808 of the third substrate 810, as compared with the embodiments of the region 'C2'. The stopper 809 may be a metal line formed in the same layer as the common source line 820. Alternatively, the stopper 809 may be a metal line formed in the same layer as at least one of the word lines 830. The second input/output contact plug 803 may be electrically connected to the second input/output pad 805 through the contact 807 and the stopper 809.

Like the second and third input/output contact plugs 803 and 804 of the second cell region CELL2, a diameter of each of the second and third input/output contact plugs 703 and 704 of the first cell region CELL1 may become progressively smaller toward the lower metal pattern 771*e* or may become progressively larger toward the lower metal pattern 771*e*.

In some embodiments, a slit 811 may be formed in the third substrate 810. For example, the slit 811 may be formed at a certain position of the external pad bonding region PA. For example, as illustrated in a region 'D', the slit 811 may be located between the second input/output pad 805 and the cell contact plugs 840 when viewed in a plan view. Alternatively, the second input/output pad 805 may be located between the slit 811 and the cell contact plugs 840 when viewed in a plan view.

In some embodiments, as illustrated in a region 'D1', the slit 811 may be formed to penetrate the third substrate 810. For example, the slit 811 may be used to prevent the third substrate 810 from being finely cracked when the opening 808 is formed. However, embodiments of the inventive concept are not limited thereto, and in certain embodiments, the slit 811 may be formed to have a depth ranging from about 60% to about 70% of a thickness of the third substrate 810.

In certain embodiments, as illustrated in a region 'D2', a conductive material 812 may be formed in the slit 811. For example, the conductive material 812 may be used to discharge a leakage current that occurs when driving the circuit elements in the external pad bonding region PA to the outside. In this case, the conductive material 812 may be connected to an external ground line.

In certain embodiments, as illustrated in a region 'D3', an insulating material 813 may be formed in the slit 811. For example, the insulating material 813 may be used to electrically isolate the second input/output pad 805 and the second input/output contact plug 803 disposed in the external pad bonding region PA from the word line bonding region WLBA. Since the insulating material 813 is formed in the slit 811, it is possible to prevent a voltage provided through the second input/output pad 805 from affecting a metal layer disposed on the third substrate 810 in the word line bonding region WLBA.

In certain embodiments, the first to third input/output pads 605, 805 and 806 may be selectively formed. For example, the memory device 500 may be realized to include only the first input/output pad 605 disposed on the first substrate 610, to include only the second input/output pad 805 disposed on the third substrate 810, or to include only the third input/output pad 806 disposed on the upper insulating layer 801.

In some embodiments, at least one of the second substrate 710 of the first cell region CELL1 or the third substrate 810 of the second cell region CELL2 may be used as a sacrificial substrate and may be completely or partially removed before or after a bonding process. An additional layer may be stacked after the removal of the substrate. For example, the second substrate 710 of the first cell region CELL1 may be removed before or after the bonding process of the peripheral circuit region PERI and the first cell region CELL1, and then, an insulating layer covering a top surface of the common source line 720 or a conductive layer for connection may be formed. Likewise, the third substrate 810 of the second cell region CELL2 may be removed before or after the bonding process of the first cell region CELL1 and the second cell region CELL2, and then, the upper insulating layer 801 covering a top surface of the common source line 820 or a conductive layer for connection may be formed.

The memory cell array 100 of FIG. 1 may be included in the first cell region CELL1 or the second cell region CELL2, and the peripheral circuit 200 may be included in the peripheral circuit region PERI.

While the inventive concept has been particularly shown and described with reference to embodiments thereof, it will be understood that various changes in form and detail may be made thereto without departing from the spirit and scope of the inventive concept as set forth in the following claims.

What is claimed is:

1. A method of operating a memory device, the method comprising:

applying a program inhibition voltage to an unselected bit line in a first program loop of a plurality of program loops;

applying a program permission voltage to a selected bit line in the first program loop;

applying a pass voltage to an unselected word line in the first program loop;

applying a program voltage to a selected word line in the first program loop;

applying a pulse voltage having a polarity opposite to a polarity of the program voltage to the selected word line after applying the program voltage to the selected word line, in the first program loop; and applying a verification voltage to the selected word line after applying the pulse voltage to the selected word line, in the first program loop, wherein the applying of the pulse voltage to the selected word line further comprises applying the pulse voltage to the selected word line in the plurality of program loops, and wherein a level of the pulse voltage increases in the plurality of program loops.

2. The method of claim 1, wherein a threshold voltage of a selected memory cell connected to the selected word line after applying the program voltage to the selected word line is higher than the threshold voltage of the selected memory cell after applying the pulse voltage to the selected word line.

3. The method of claim 1, wherein the applying of the program inhibition voltage to the unselected bit line further comprises applying the program inhibition voltage to the unselected bit line during a first time period and a second time period following the first time period, wherein the applying of the program voltage to the selected word line further comprises applying the program voltage to the selected word line during the first time period, and wherein the applying of the pulse voltage to the selected word line further comprises applying the pulse voltage to the selected word line during the second time period.

4. The method of claim 3, further comprising initializing voltage levels of the selected bit line, the unselected bit line, the selected word line, and the unselected word line after the second time period in the first program loop.

5. The method of claim 1, wherein the applying of the pulse voltage to the selected word line further comprises:

applying the pulse voltage to the selected word line in first to k−1th (k is a natural number greater than or equal to 2) program loops among the plurality of program loops, a level of the pulse voltage increasing in the first to k−1th program loops; and applying the pulse voltage to the selected word line in a kth program loop to an Nth (N is a natural number greater than or equal to k+1) program loop among the plurality of program loops, a level of the pulse voltage being equal in the kth to Nth program loops.

6. The method of claim 1, wherein the applying of the pulse voltage to the selected word line further comprises applying the pulse voltage to the selected word line in the plurality of program loops, a pulse width of the pulse voltage increasing in the plurality of program loops.

7. The method of claim 1, wherein the applying of the pulse voltage to the selected word line further comprises:

applying the pulse voltage to the selected word line in first to k−1th (k is a natural number greater than or equal to 2) program loops among the plurality of program loops, a pulse width of the pulse voltage increasing in the first to k−1th program loops; and applying the pulse voltage to the selected word line in a kth program loop to an Nth (Nis a natural number greater than or equal to k+1) program loop among the plurality of program loops, a pulse width of the pulse voltage being equal in the kth to Nth program loops.

8. A method of operating a memory device, the method comprising:

applying a program inhibition voltage to an unselected bit line in each of a plurality of program loops;

applying a program permission voltage to a selected bit line in each of the plurality of program loops;

applying a pass voltage to an unselected word line in each of the plurality of program loops;

applying a program voltage to a selected word line in each of the plurality of program loops; and applying a pulse voltage having a polarity opposite to a polarity of the program voltage to the selected word line after applying the program voltage to the selected word line in a first program loop of the plurality of program loops, wherein the applying of the pulse voltage to the selected word line further comprises:

applying a first pulse voltage having a first pulse width to the selected word line in the first program loop; and applying a second pulse voltage having a second pulse width to the selected word line in a second program loop among the plurality of program loops, and wherein the first pulse width is less than the second pulse width.

9. The method of claim 8, wherein a threshold voltage of a selected memory cell connected to the selected word line after applying the program voltage to the selected word line in the first program loop is higher than the threshold voltage of the selected memory cell after applying the pulse voltage to the selected word line in the first program loop.

10. The method of claim 8, wherein the applying of the pass voltage to the unselected word line further comprises applying a pass voltage to the unselected word line in first and second time periods of each of the plurality of program loops, wherein the applying of the program voltage to the selected word line further comprises applying the program voltage to the selected word line during the first time period, and wherein the applying of the pulse voltage to the selected word line further comprises applying the pulse voltage to the selected word line during the second time period.

11. The method of claim 10, further comprising:

initializing voltage levels of the selected bit line, the unselected bit line, the selected word line, and the unselected word line after the second time period; and applying a verification voltage to the selected word line after the initializing of the voltage levels of the selected bit line, the unselected bit line, the selected word line, and the unselected word line.

12. The method of claim 8, wherein the applying of the pulse voltage to the selected word line further comprises:

applying a first pulse voltage to the selected word line in the first program loop; and applying a second pulse voltage to the selected word line in a second program loop among the plurality of program loops, and wherein a voltage level of the first pulse voltage is lower than a voltage level of the second pulse voltage.

13. The method of claim 12, wherein the applying of the pulse voltage to the selected word line further comprises applying a third pulse voltage to the selected word line in a third program loop among the plurality of program loops, and wherein a voltage level of the third pulse voltage is the same as a voltage level of the second pulse voltage.

14. The method of claim 8, wherein the applying of the pulse voltage to the selected word line further comprises applying a third pulse voltage having a third pulse width to the selected word line in a third program loop among a plurality of program loops, and wherein the third pulse width is the same as the second pulse width.

15. A memory device comprising:

a memory cell array connected to a plurality of word lines and a plurality of bit lines;

a voltage generator configured to generate voltages to be applied to the plurality of word lines; and a control circuit configured to control a program operation for a plurality of memory cells of the memory cell array, wherein, during the program operation, the control circuit controls the voltage generator to generate a pass voltage to be applied to an unselected word line, and a program voltage and a pulse voltage having a polarity opposite to a polarity of the program voltage to be sequentially applied to a selected word line, wherein the control circuit controls the voltage generator to generate the pulse voltage having an increasing voltage level in two or more of a plurality of program loops.

16. The memory device of claim 15, further comprising a page buffer circuit configured to apply voltages to the bit lines, wherein, during the program operation, the control circuit controls the page buffer circuit to apply a program inhibition voltage to an unselected bit line and a program permission voltage to a selected bit line.

17. The memory device of claim 15, wherein the control circuit controls the voltage generator to generate the pulse voltage having an increasing pulse width in two or more of the plurality of program loops.

* * * * *